United States Patent
Ricker et al.

(10) Patent No.: US 10,862,252 B2
(45) Date of Patent: Dec. 8, 2020

(54) SURFACE-CONTACT ETHERNET CONNECTOR, NETWORK EQUIPMENT CHASSIS INCLUDING THE SAME AND OPERATING METHOD THEREOF

(71) Applicant: The Ricker Lyman Robotic Company Inc., Beacon, NY (US)

(72) Inventors: Jeffrey Ricker, East Fishkill, NY (US);
Paul Lyman, Cedar Rapids, IA (US);
Ihor Baranovskyi, Vinnytsia (UA);
Kostiantyn Kravtsov, Vinnytsia (UA);
Alec Marin, Cedar Rapids, IA (US)

(73) Assignee: The Ricker Lyman Robotic Company, Inc., Beacon, NY (US)

( * ) Notice: Subject to any disclaimer, the term of this patent is extended or adjusted under 35 U.S.C. 154(b) by 0 days.

(21) Appl. No.: 16/401,800

(22) Filed: May 2, 2019

(65) Prior Publication Data

US 2019/0341728 A1    Nov. 7, 2019

Related U.S. Application Data

(60) Provisional application No. 62/666,894, filed on May 4, 2018.

(51) Int. Cl.
| | |
|---|---|
| *H01R 24/64* | (2011.01) |
| *H01R 13/62* | (2006.01) |
| *H01R 13/66* | (2006.01) |
| *H01R 13/514* | (2006.01) |

(52) U.S. Cl.
CPC .......... *H01R 24/64* (2013.01); *H01R 13/514* (2013.01); *H01R 13/6205* (2013.01); *H01R 13/6658* (2013.01)

(58) Field of Classification Search
CPC .. H01R 24/64; H01R 13/514; H01R 13/6205; H01R 13/6558
USPC ........................................... 459/40
See application file for complete search history.

(56) References Cited

U.S. PATENT DOCUMENTS

| | | | | | |
|---|---|---|---|---|---|
| 5,677,830 | A | * | 10/1997 | Nogas ............... | H05K 5/0021 361/732 |
| 5,984,732 | A | * | 11/1999 | Mehring ............. | H05K 5/0021 439/701 |
| 6,036,505 | A | * | 3/2000 | Zell ................... | H05K 1/145 439/74 |

(Continued)

OTHER PUBLICATIONS

Jeffery Ricker, "Hivecell", powerpoint, 2015, Ricker Lyman Robotic LLC.

(Continued)

*Primary Examiner* — Alexander Gilman
(74) *Attorney, Agent, or Firm* — McCarter & English, LLP

(57) ABSTRACT

A system and method includes stacking a first network node and a second network node on each other, making a surface contact between the network nodes using a first surface connector disposed on an upper surface of a first chassis of the first network node and a second surface connector on a lower surface of the second network node, directly connecting one of the first network node and the second network node to a computer network, and controlling another of the first network node and the second network node to connect the computer network through the surface contact made using the first surface connector and the second surface connector.

14 Claims, 26 Drawing Sheets

(56) References Cited

U.S. PATENT DOCUMENTS

| | | | | |
|---|---|---|---|---|
| 6,431,879 B2* | 8/2002 | Brekosky | H05K 7/142 361/804 |
| 8,767,409 B2* | 7/2014 | Cheng | H01L 23/552 361/763 |
| 8,769,171 B2* | 7/2014 | Aronson | G02B 6/4246 710/63 |
| 8,938,166 B2* | 1/2015 | Roullot | H04B 10/40 398/135 |
| 9,013,980 B2* | 4/2015 | Lontka | H04L 12/10 370/221 |
| 9,094,339 B2* | 7/2015 | Karam | H04L 41/5067 |
| 9,124,049 B2* | 9/2015 | Yuen | H01R 24/64 |
| 9,267,327 B2* | 2/2016 | Feldstein | G05B 11/01 |
| 9,319,101 B2* | 4/2016 | Lontka | G01R 31/50 |
| 9,450,815 B2* | 9/2016 | Spock | H04L 41/0806 |
| 9,509,432 B2* | 11/2016 | Beshai | H04J 14/08 |
| 9,622,370 B2* | 4/2017 | Gehrke | H01H 27/00 |
| 9,801,300 B2* | 10/2017 | Wang | H05K 7/1435 |
| 9,831,593 B1* | 11/2017 | Tartaglia | H01R 13/465 |
| 9,876,653 B1* | 1/2018 | Stamatakis | F24F 11/56 |
| 9,900,103 B1* | 2/2018 | Lee | H04B 10/40 |
| 9,901,000 B2* | 2/2018 | Kraus | G06N 20/00 |
| 9,907,195 B2* | 2/2018 | Montazeri | H05K 5/023 |
| 9,912,085 B2* | 3/2018 | Gehrke | H01R 29/00 |
| 10,008,817 B2* | 6/2018 | Fullerton | H01R 31/065 |
| 10,142,196 B1* | 11/2018 | Stamatakis | H04L 67/12 |
| 10,149,141 B1* | 12/2018 | Stamatakis | H04L 41/0806 |
| 10,171,033 B2* | 1/2019 | Yong | H03B 5/32 |
| 10,200,876 B2* | 2/2019 | Akman | H04W 16/20 |
| 10,237,169 B2* | 3/2019 | Bernat | H04L 49/10 |
| 10,511,349 B2* | 12/2019 | Kahlman | H04B 5/0056 |
| 10,516,366 B2* | 12/2019 | Yong | H03L 7/06 |
| 2006/0223380 A1* | 10/2006 | King | H01R 13/641 439/676 |
| 2006/0271575 A1* | 11/2006 | Harris | G06F 9/52 |
| 2007/0072442 A1* | 3/2007 | DiFonzo | H01R 13/6205 439/39 |
| 2008/0068816 A1* | 3/2008 | Han | H01R 11/30 361/760 |
| 2008/0123667 A1* | 5/2008 | Pogatzki | G06Q 20/382 370/400 |
| 2009/0170359 A1* | 7/2009 | Chin | H01R 13/7033 439/188 |
| 2010/0151738 A1* | 6/2010 | Chou | G06T 17/10 439/638 |
| 2010/0167576 A1* | 7/2010 | Zhou | H01J 61/327 439/375 |
| 2010/0311300 A1* | 12/2010 | Hansen | A63H 33/042 446/91 |
| 2012/0021619 A1* | 1/2012 | Bilbrey | H01R 13/6205 439/39 |
| 2013/0050958 A1* | 2/2013 | Bdeir | H01R 13/6205 361/730 |
| 2013/0343025 A1* | 12/2013 | Bdeir | H01R 13/6205 361/803 |
| 2016/0226182 A1* | 8/2016 | Szeto | H01R 11/30 |
| 2017/0149171 A1* | 5/2017 | Szeto | G06F 1/16 |
| 2019/0029132 A1* | 1/2019 | Haba | H05K 5/065 |
| 2019/0341728 A1* | 11/2019 | Ricker | G06F 1/16 |

OTHER PUBLICATIONS

Sarnovsky et al, "Big Data Processing and Analytics Platform Architecture for Process Industry Factories", Jan. 26, 2018.

* cited by examiner

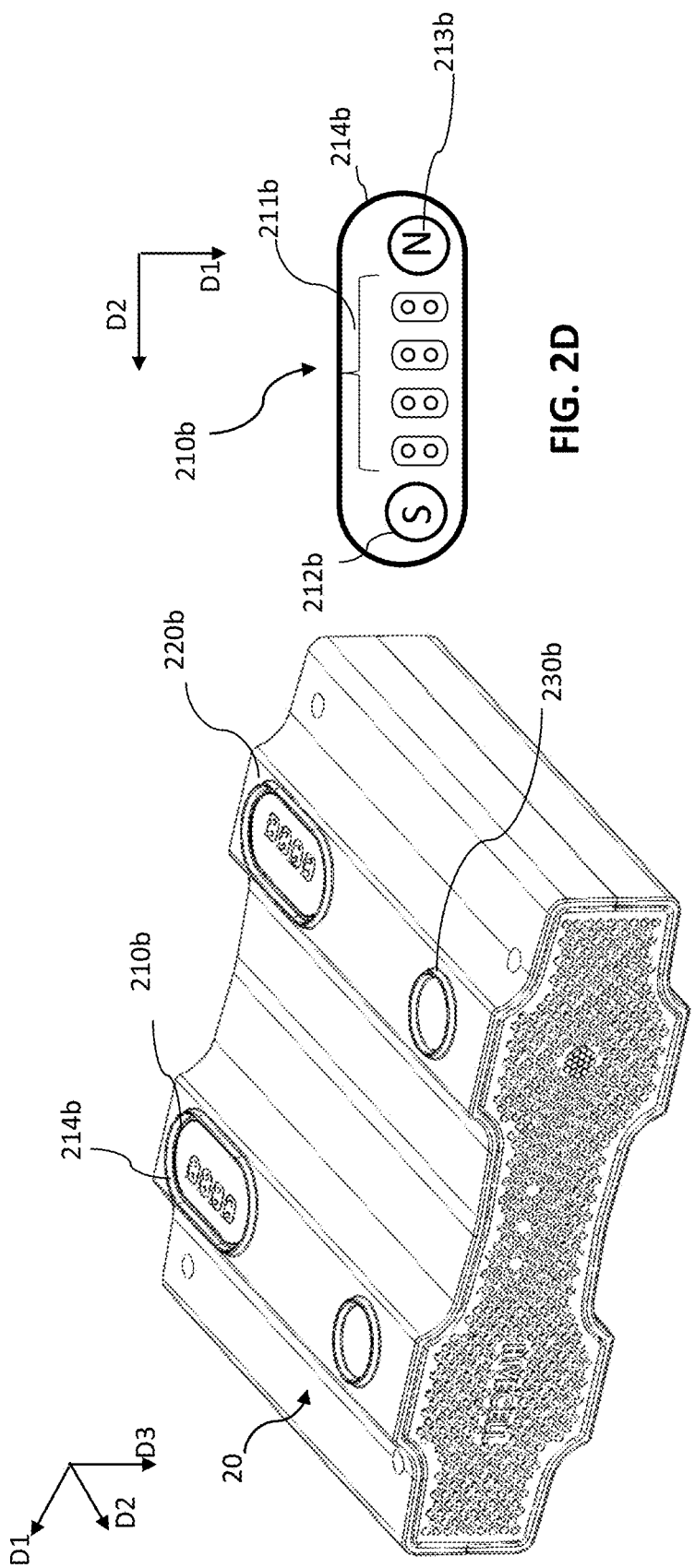

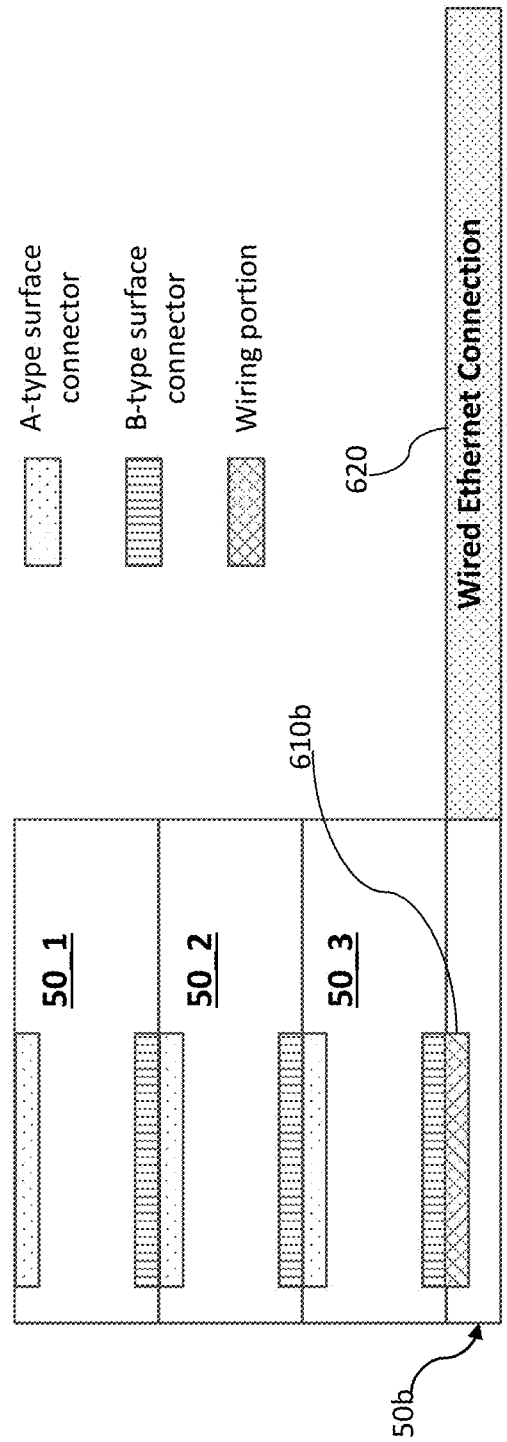

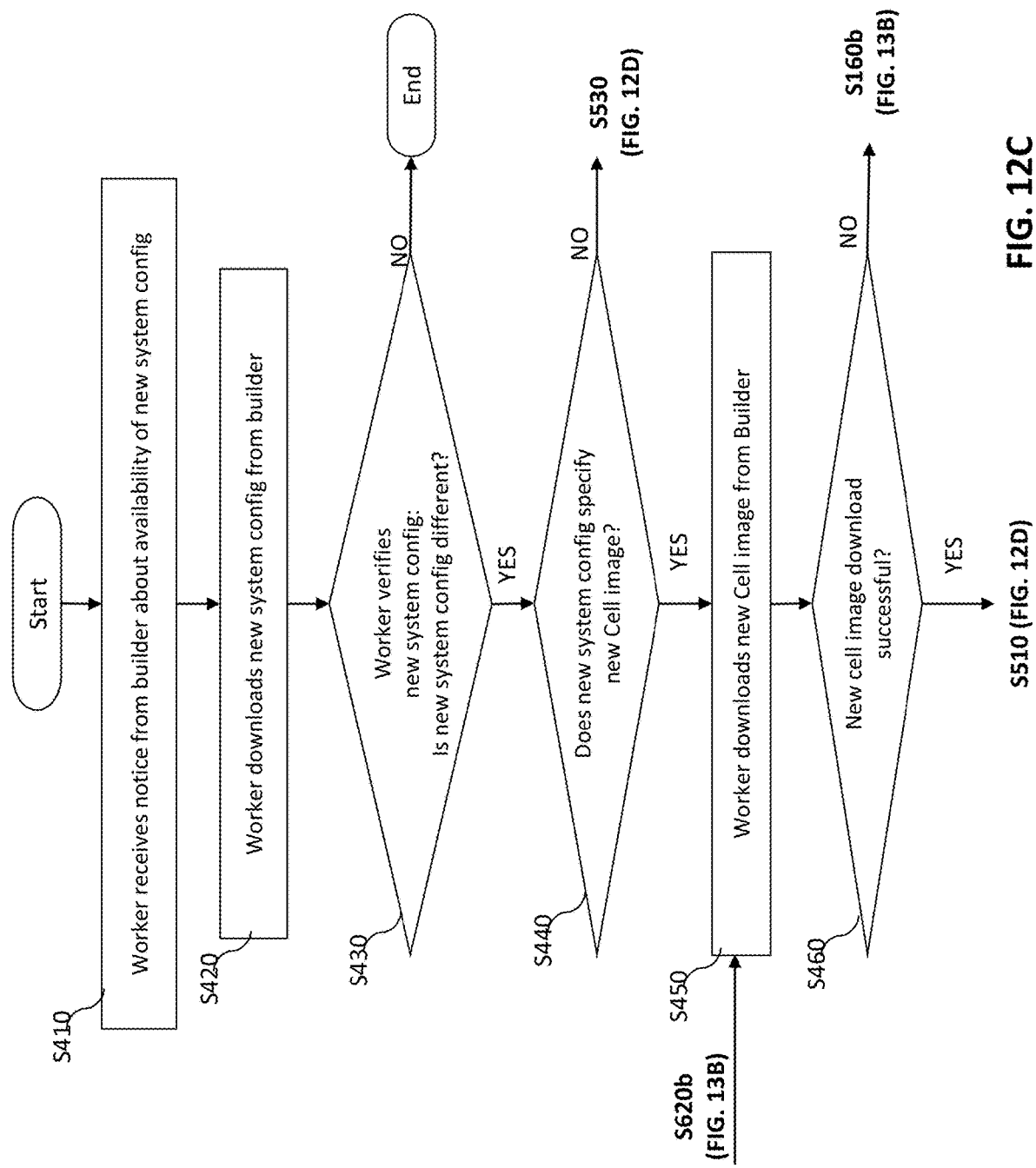

SURFACE-CONTACT ETHERNET CONNECTOR, NETWORK EQUIPMENT CHASSIS INCLUDING THE SAME AND OPERATING METHOD THEREOF

CROSS-REFERENCE TO RELATED APPLICATION

This application claims the benefit of U.S. Provisional Application No. 62/666,894, filed May 4, 2018, the entire contents of which are incorporated herein by reference.

TECHNICAL FIELD

This application relates to network nodes that can be stacked and surface-contacted on each other using surface-contact connectors, and a method for operating the network nodes.

BACKGROUND

In big data analysis, as compared to the extensive progress in the software area, hardware has yet to sufficiently be developed. For example, modern software such as 'Hadoop' is designed to run on multiple servers. However, traditional servers are relatively big and cost thousand dollars and use a lot of energy, so big data is a significant challenge to most midsized firms.

There is a need for an effective hardware solution with a simple configuration providing better computing power for less money, less energy, and less space.

More particularly, given to the fact that the conventional wired network connectors such as RJ45 connectors are prone to break, and the cable arrangement become complicated when a large number of servers are connected by these conventional connectors, new connection methods addressing the above issues are needed.

SUMMARY OF THE INVENTION

Aspects of the present disclosure are directed to surface-contact connectors, a system using the surface-contact connectors, and method of operating the system.

In an aspect of the present disclosure, there is provided a network node. The network node includes a first surface connector configured to provide an electrical connection at least one of data or power system.

In another aspect of the present disclosure, there is provided a system including a network node and another network node having a same physical configuration as the network node. The network node and the another network node are stacked on each other. The network node is in communication with the another network node through a surface contact between the network node and the another network node.

In still another aspect of the present disclosure, there is provided a data processing system. The data processing system includes a management system, a master network node, and at least one slave network node. The management system is configured to receive an update request for a new configuration of the data processing system and notify a master network node that the new configuration of the data processing network system is available. The master network node is configured to receive the new configuration from the management system upon receipt of the notification, acquire a new cell configuration and a new framework configuration from the new configuration, update a cell configuration and a framework configuration with the new cell configuration and the new framework configuration, and notify at least one slave network node that the new configuration is available. The at least one slave network node is configured to receive the new configuration from the master network node upon receipt of the notification, acquire a new cell configuration and a new framework configuration from the new configuration, and apply the new cell configuration and the new framework configuration.

In still another aspect of the present disclosure, there is provided a method for operating a data processing system. The method includes: receiving, by a management system, an update request for a new configuration of the data processing system; notifying, by the management system, a master network node that the new configuration of the data processing network system is available; receiving, by the master network node, the new configuration from the management system upon receipt of the notification; acquiring, by the master network node, a new cell configuration and a new framework configuration from the new configuration; updating, by the master network node, a cell configuration and a framework configuration with the new cell configuration and the new framework configuration; notifying, by the master network node, the at least one slave network node that the new configuration is available; receiving, by the at least one slave network node, the new configuration from the master network node upon receipt of the notification; acquiring, by the at least one slave network node, a new cell configuration and a new framework configuration from the new configuration; and applying, by the at least one slave network node, the new cell configuration and the new framework configuration.

BRIEF DESCRIPTION OF THE DRAWINGS

The present disclosure will become more readily apparent from the specific description accompanied by the drawings.

FIG. 2C depicts a bottom perspective view of the network node of FIG. 2A;

FIG. 2D depicts an Ethernet surface connector at the bottom of the network node of FIG. 2A;

FIG. 6B is a view illustrating multiple network nodes stacked where a base unit is used to cover a bottom network node according to an exemplary embodiment of the present disclosure;

FIGS. 11, 12A-12D and 13A-13E depict flow charts of a method for updating the system with new system configuration or new cell image according to an exemplary embodiment of the present disclosure;

DETAILED DESCRIPTION

Figure 1:
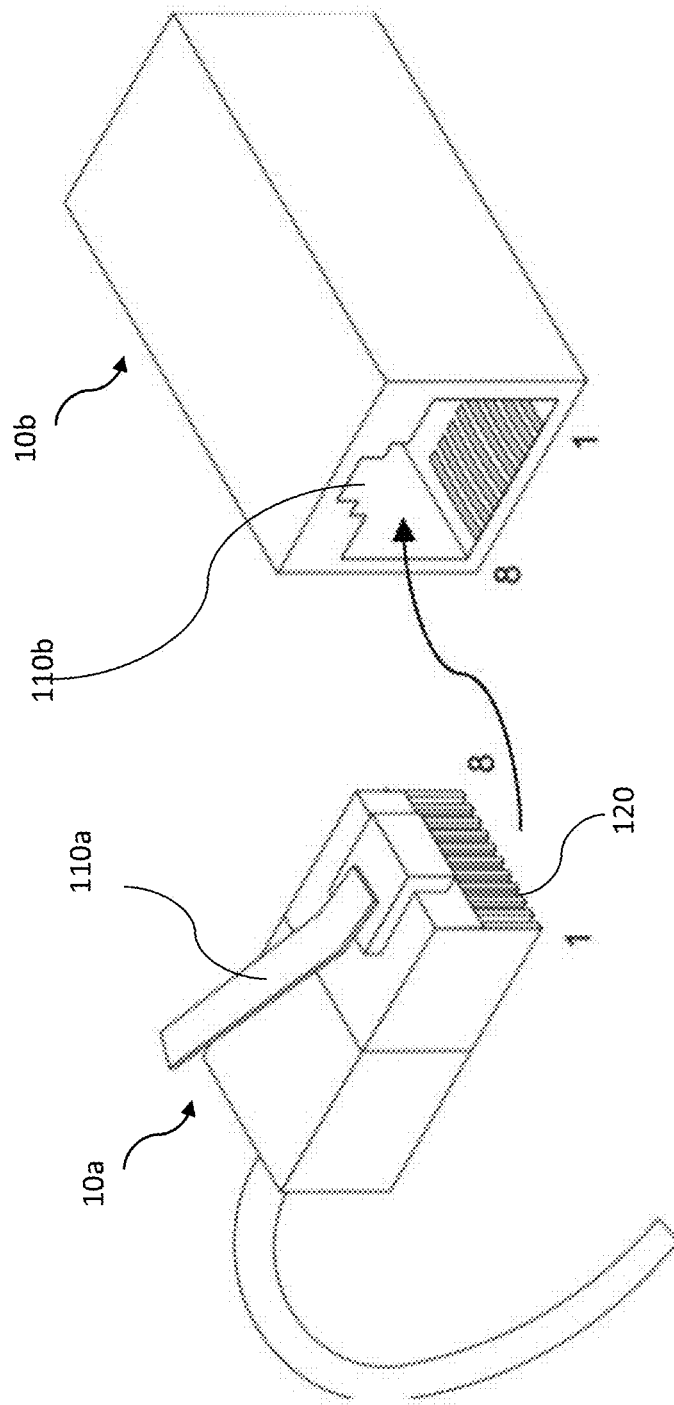
FIG. 1 depicts standard Ethernet plug and port according to prior art.

The present disclosure may be understood more readily by reference to the following detailed description of the disclosure taken in connection with the accompanying drawing figures, which form a part of this disclosure. It is to be understood that this disclosure is not limited to the specific devices, methods, conditions or parameters described and/or shown herein, and that the terminology used herein is for the purpose of describing particular embodiments by way of example only and is not intended to be limiting of the claimed disclosure.

Also, as used in the specification and including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "(network) node" can be interchangeable with "computing node or device", "(network) cell", or etc. The network node can be understood to mean any piece of network equipment or devices that are connected to a computer network.

Examples of the network node include servers, personal computers, system-on-chips, modems, routers, packet sniffers, firewalls and other network security devices, network attached storage (NAS) devices, printers and other networked peripherals, etc.

Each network node may include, but are not limited: a computing server, a communication interface with a connector, and a chassis incorporating the server and the communication interface.

The term "builder" can be understood as "builder node or cell", "master node or cell", etc. The term "worker" can be understood as "worker node or cell", "slave node or cell", etc.

Exemplary embodiments of the present disclosure provide a network connector that uses a surface contact, rather than an insertion of a tabbed plug into a port. Magnets are formed in each surface network connector to pull it into contact and to reject an improper connection. Moreover, by incorporating the aforementioned surface contact connectors into a network node, multiple pieces of network nodes may be simply stacked to establish a network connection for each stacked piece of node.

For the sake of description, the present disclosure will be described with reference to an Ethernet connector as only an example of the network connector upon provided to each network node, however the scope or exemplary embodiments of the present disclosure are not limited thereto.

For example, in the present disclosure, it should be understood that network node(s) are in communication with each other or external network, in a wired or wireless manner, using a communication method other than Ethernet. Thus, the terms "Ethernet (surface) connector", "RJ45 connector", "modified RJ45 connector", or the like, are only examples of the network connector.

In addition, the term "plug' refers to a cable or "male" end of a network connection while the term "port" refers to a "jack", "socket", "receptable" or "female" end.

In the present disclosure, network nodes use a standard communication (or network) connector for an Ethernet connection. For example, referring to FIG. 1, each network node incorporates a typical Ethernet connector port, e.g., RJ45 port 10b to which an RJ45 plug 10a having eight pins 120 and one locking tab 11a on a reserves side is inserted, as shown in FIG. 1, so that the RJ45 plug 10a can be plugged into the RJ45 port 10b to provide an electrical connection between the network nodes. The locking tab 110a of the RJ45 plug 10a can engage with a corresponding receptacle/slot 110b of the RJ45 port 10b, as shown in FIG. 1.

However, as this means of connection is tedious and prone to breaking, exemplary embodiments of the present disclosure use surface Ethernet contacts to receive an Ethernet connection. Each surface Ethernet contact may have a set of N (e.g., N=8) exposed pins that are approximately flush with the tops of two bar magnets disposed at opposite sides of the N pins, which will be described with reference to FIGS. 2A to 2C.

Figure 2B:
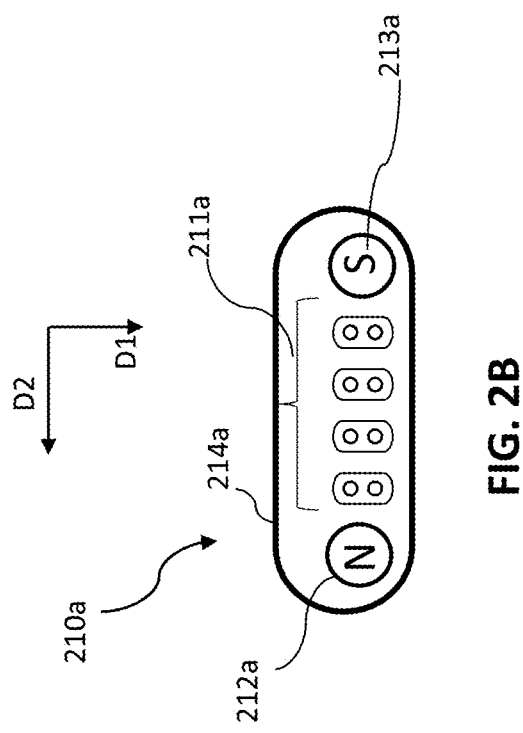
FIG. 2B depicts an Ethernet surface connector at the top of the network node of FIG. 2A.
Figure 2A:
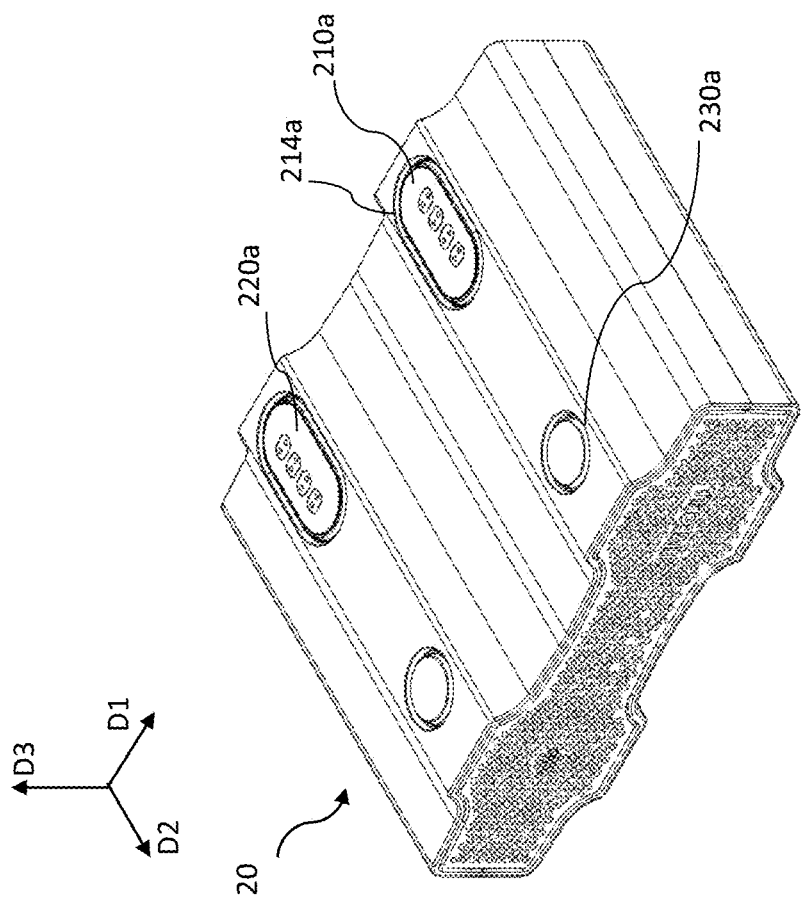
FIG. 2A depicts a top perspective view of an example network node according to an exemplary embodiment of the present disclosure.

FIG. 2A depicts a top perspective view of an example network node 20 according to an exemplary embodiment of the present disclosure. FIG. 2B depicts an Ethernet surface connector at the top of the network node 20 according to an exemplary embodiment of the present disclosure. FIG. 2C depicts a bottom perspective view of the network node 20.

Figure 2E:
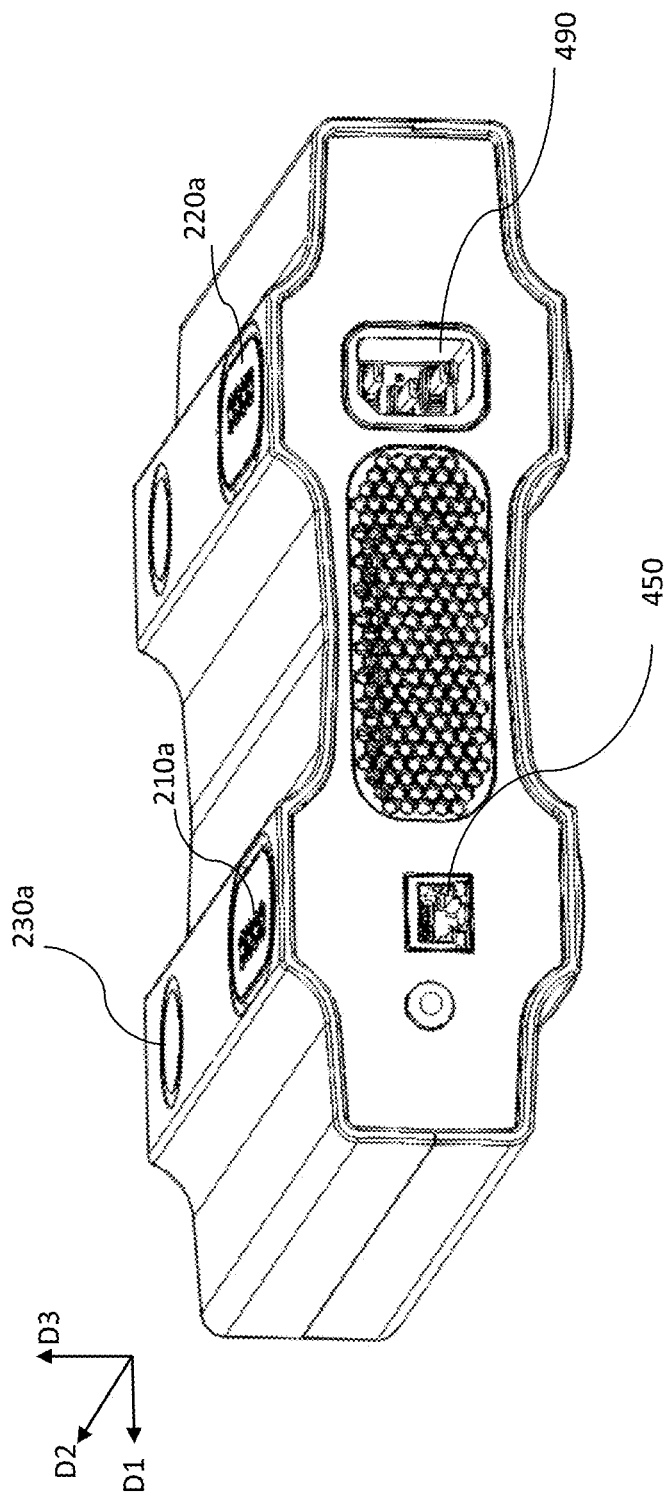
FIG. 2E depicts a rear perspective view of the network node of FIG. 2A.
Figure 3A:
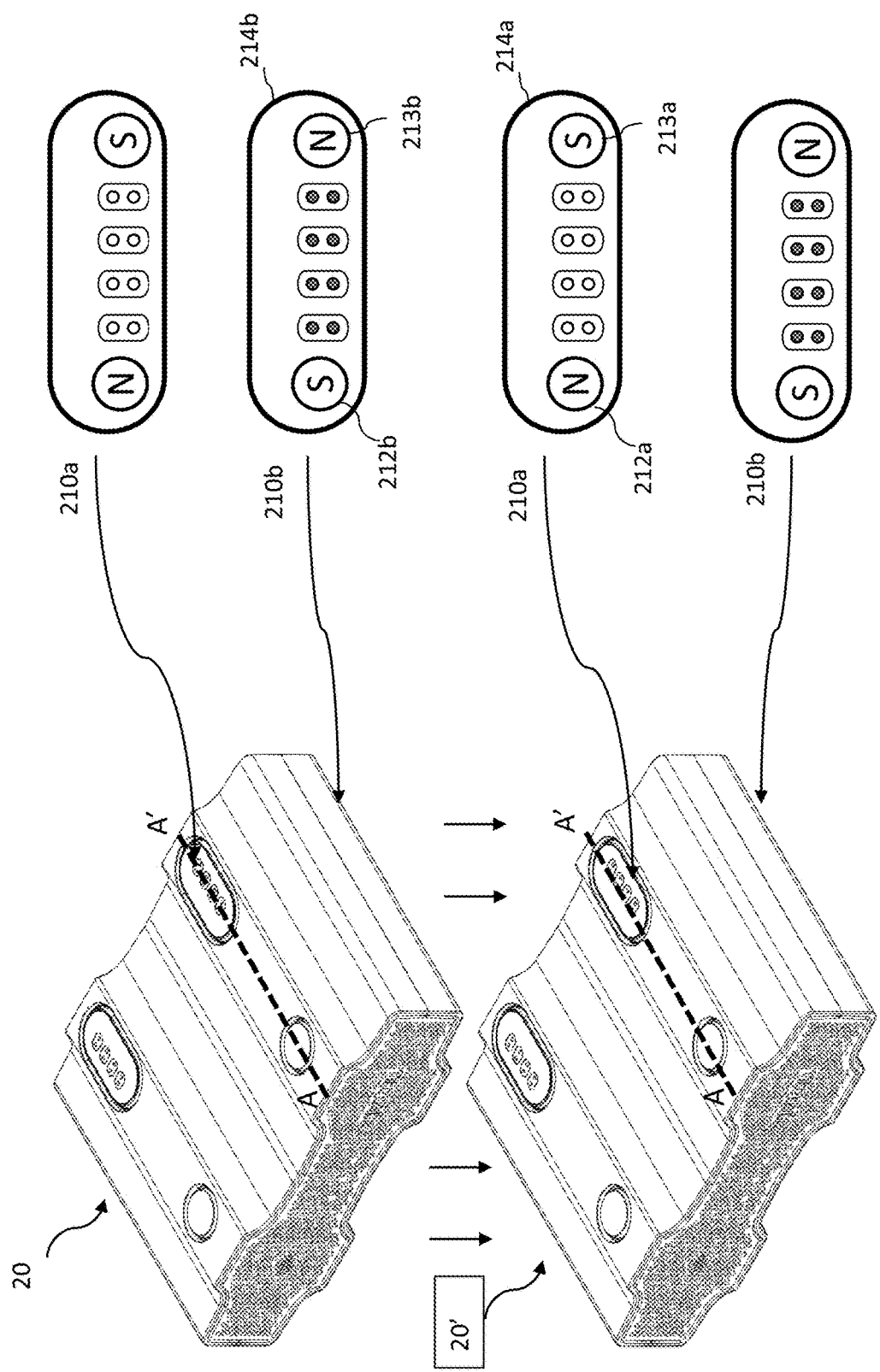
FIG. 3A depicts an example scenario where the network node of FIG. 2A is stacked on another network node according to an exemplary embodiment of the present disclosure.
Figure 3B:
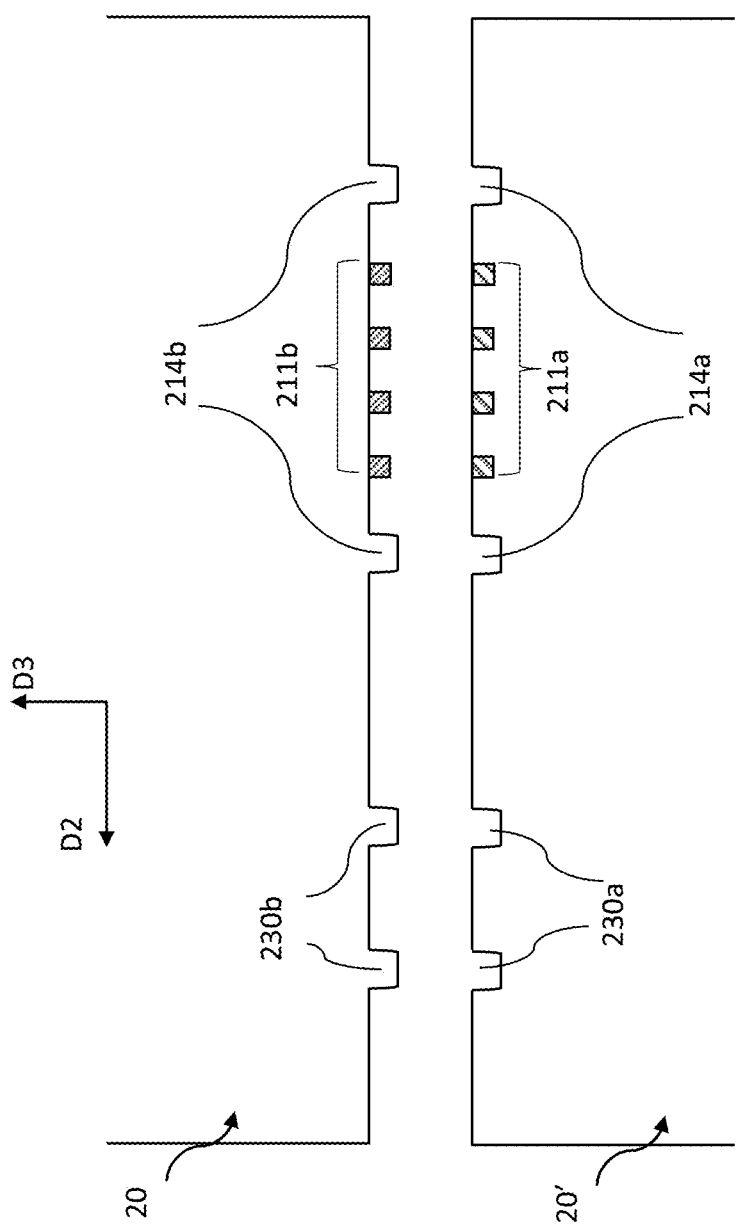
FIG. 3B depicts a sectional view of two stacked network nodes when taken along with A-A', according to an exemplary embodiment of the present application.

FIG. 2D depicts an Ethernet surface connector at the bottom of the network node 20 according to an exemplary embodiment of the present disclosure. FIG. 2E depicts a rear perspective view of the network node 20 according to another exemplary embodiment of the present disclosure. FIG. 3A depicts an example scenario where one network node 20 is stacked on another network node 20' according to an exemplary embodiment of the present disclosure. FIG. 3B depicts a sectional view of two stacked network nodes when taken along with A-A', according to an exemplary embodiment of the present application.

Referring now to FIGS. 2A-2D, a network node 20 includes an Ethernet surface connector 210a on a top surface thereof (see FIG. 2A) and another Ethernet surface connector 210b on a bottom surface thereof (see FIG. 2C). Referring further to FIG. 3A, another network node 20' on which the network node 20 is stacked has substantially the same configuration and/or physical shape as the network node 20, so that the network node 20' includes an Ethernet surface connector 210a on a top surface thereof and another Ethernet surface connector 210b on a bottom surface thereof. Although not shown, additional network node(s) each having substantially the same configuration and physical shape as the network node 20 can be stacked on the stack of FIG. 3A.

For the sake of the description, the Ethernet surface connectors (e.g., 210a and 210b) on the top and bottom surfaces of a network node are referred to as an "A-type surface connector" and a "B-type surface connector", respectively.

However, the locations on which the Ethernet surface connectors are provided are not limited to what are depicted in FIGS. 2A and 2C. Further, more details of the Ethernet surface connectors 210a and 210b are described with reference to FIGS. 2B and 2D, respectively.

Referring back to FIGS. 2A and 2C, the network node 20 may further optional features such as a pair of power surface connectors 220a and 220b and a pair of supporting members 230a and 230b. The power surface connectors 220a and 220b may be provided on the top surface and the bottom surface thereof, respectively, which provides a power supplying channel between the network nodes 20 and 20' when the nodes are stacked on each other. In addition, the supporting members 230a and 230b may be provided on the top surface and the bottom surface of the network node 20, respectively. The supporting member 230a may be formed in groove, and the supporting member 230a may be formed in protrusion, or vice versa, so that the network node 20 is stacked on the network node 20', the pair of groove and protrusion structure 230a and 230b can prevent the network nodes from moving in a lateral direction, so a physical engagement between the nodes is further enhanced.

In addition, referring now to FIGS. 2B and 2D, the periphery 214a of the A-type surface connector 210a on the top surface of the network node 20 is formed in groove while the periphery 214b of the B-type surface connector 210b of the network node 20' is formed in protrusion, or vice versa at the periphery. Further, the pins 211a of the A-type surface connector 210a may be indented, and the pins 211b of the B-type surface connector 210b may be slightly elevated (or protruded) in a compressible manner, such as by spring pins (e.g., model numbers 858-22-00X-10-0X1101, 858-22-00X-30-0X1101 and 858-22-00X-30-6X1101 manufactured by Mill-Max Mfg. Corp.). Alternatively, this structure of elevation and indentation can be reversed.

Thus, referring further to FIGS. 3A and 3B illustrating a sectional view taken along with A-A' when the network nodes 20 and 20' are stacked, the A-type surface connector 210a and the B-type surface connector 210b have an opposite structure in a vertical direction D3.

For example, the periphery 214b of the B-type surface connector 210b on the bottom surface of the network node 20 is formed in protrusion, and the periphery 214a of the A-type surface connector 210a on the top surface of the network node 20' is formed in groove. Similarly, the pins 214b of the B-type surface connector 210b on the bottom surface of the network node 20 is formed in protrusion, and the pins 211a of the A-type surface connector 210a on the top surface of the network node 20' is formed in groove. Thus, when the network nodes 20 and 20' are stacked, a physical mechanical mating between the network nodes 20 and 20' is enhanced.

Referring further to FIG. 3B, the supporting member 230b on the bottom surface of the network node 20 is formed in protrusion, and the supporting member 230a on the top surface of the network node 20' is formed in groove, so that when the network nodes 20 and 20' are stacked, a physical mechanical mating between the network nodes 20 and 20' is further enhanced.

In one embodiment, referring back to FIGS. 2B and 2D, the Ethernet surface connector 210a may further include at least two bar magnets 212a and 213a, and the N exposed pins 211a may be flanked by the tops of the two bar magnets 212a and 213a disposed at opposite sides of the N pins 211a. In this case, the Ethernet surface connector 210b provided on the bottom of the network node 20 may have two bar magnets 212b and 213b disposed at opposite sides of N pins 211b of the Ethernet surface connector 210b, as shown in FIG. 2D, so that when the network node 20 is stacked on the network node 20', the Ethernet surface connector 210b on the bottom surface of the network node 20 can mate with the Ethernet surface connector 20' on the top surface of the another network node (e.g., 20') to enhance a physical engagement between the network nodes, preventing one from moving against another. However, the bar magnets are only optional features, but they are not necessarily included in each network node.

In the A-type surface connector 210a, the two magnets 212a and 213a are disposed to have opposite poles at the top surface of the network node 20; for example, referring to FIG. 2B, the magnet 212a is disposed north-side-up and the magnet 213a is disposed south-side-up at the top surface of the network node 20. Further, in the B-type surface connector 210b provided on the bottom surface of the network node 20, the two magnets are disposed to have opposite poles to each other at the bottom surface of the network node 20, but each magnet of the bottom Ethernet surface connector 210b may have an opposite pole to a corresponding magnet of the top Ethernet surface connector 210a, so that when the network node 20 is stacked on another network node having substantially the same configuration as the network node 20, the magnets will work to attract each other to ensure a proper mating between the stacked network nodes.

Although it is illustrated in FIGS. 2B and 2D that the shape of each bar magnet is of circular when viewed from the top, exemplary embodiments of the present disclosure are not limited thereto; for example, the shape in the top view can be of rectangular or any other arbitrary shape.

Referring back to FIGS. 2A and 2C, the power surface connectors 220a and 220b have substantially the same configuration and physical shape except for an opposite vertical structure in terms of periphery and power pins and/or in opposite magnetic poles of optional magnets, as do the Ethernet surface connectors 210*a* and 210*b*. Duplicate description thereof will be omitted for the sake of simplicity.

Referring back to FIG. 3A, the B-type surface connector 210*b* of the network node 20 can mate with the A-type surface connector 210*a* of the network node 20' when the network nodes 20 and 20' are stacked, so that a network connection between the two stacked network nodes can be established through the surface contact. In this manner, multiple network nodes can be vertically stacked and the act of stacking such network nodes would enable an Ethernet connection between the network nodes, which allows the network nodes or servers included in the nodes to work in a collaborate manner for, e.g., big data processing. In other words, as can be further seen from FIG. 3A, when the two network nodes 20 and 20' are stacked, a connection is made between the B-type surface connector 210*b* on the bottom surface of the network node 20 and the A-type surface connector 210*a* on the top surface of the network node 20'. As the B-type surface connector 210*b* on the bottom of the network node 20 gets closer to contact the A-type surface connector 210*a* on the top of the network node 20', the magnets facing in opposite poles will attract each other and engage the two connectors, so the pins will meet each other properly and establish a good electric interface.

Although it is illustrated in the figures that N pins are arranged in two rows, exemplary embodiments of the present disclosure are not limited thereto. For example, another number of pins can be arranged in a single row, or any other arbitrary manner.

Figure 4A:
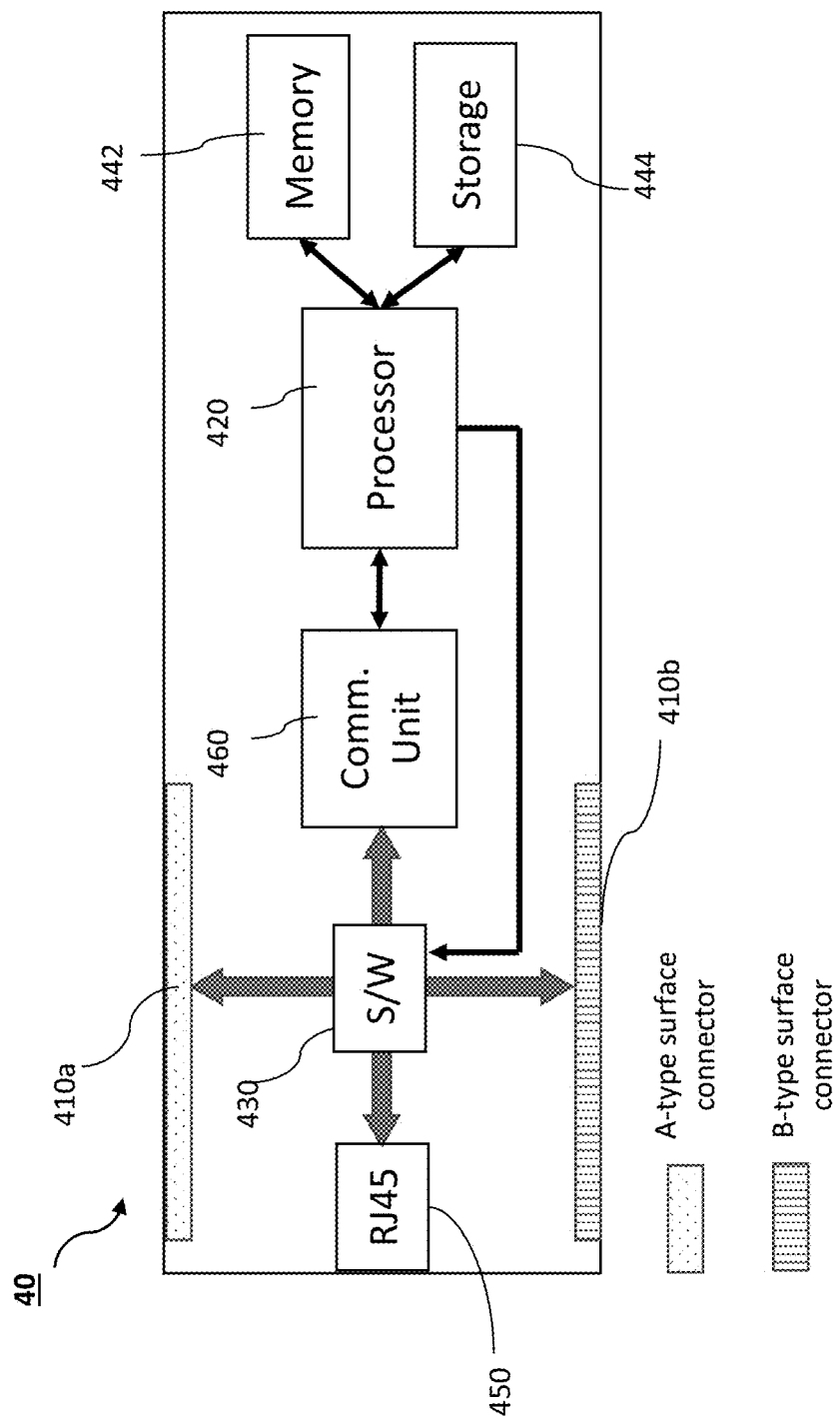
FIG. 4A depicts a block diagram of an example network node according to an exemplary embodiment of the present disclosure.
Figure 4B:
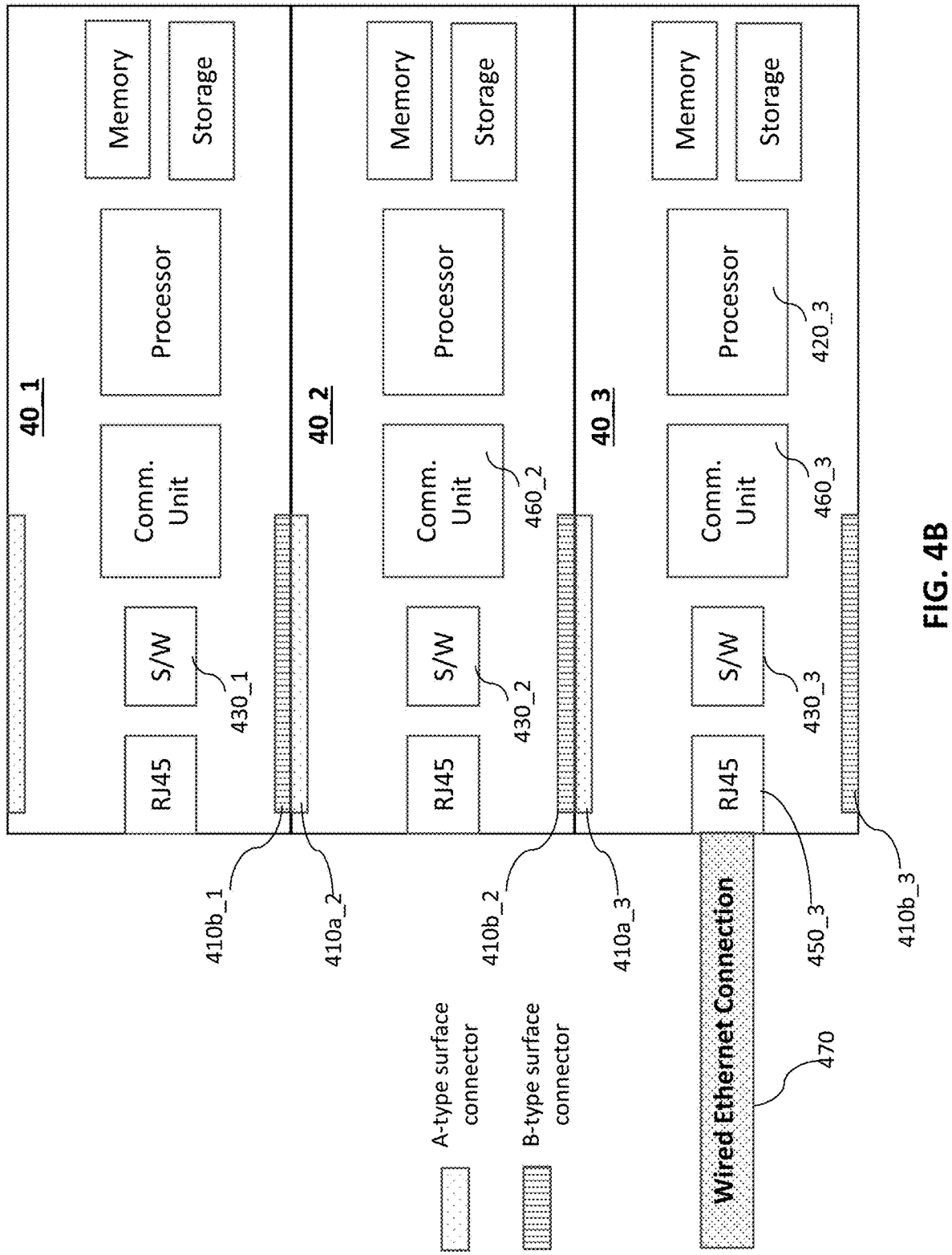
FIG. 4B is a view illustrating an example configuration of stacked multiple network nodes in communication with each other according to an exemplary embodiment of the present disclosure.

FIG. 4A depicts a block diagram of an example network node according to an exemplary embodiment of the present disclosure. FIG. 4B is a view illustrating an example configuration of stacked multiple network nodes in communication with each other according to an exemplary embodiment of the present disclosure.

Referring now to FIG. 4A, the network node 40 includes a processor 420, a memory 442, a storage 444, an A-type surface connector 410*a*, a B-type surface connector 410*b*, a communication unit 460, a typical Ethernet connection port 450, a switch unit (circuit) 430, and a chassis incorporating the aforementioned elements. Although it is illustrated in figures that a single line is used to show a connection between elements, the line does not necessarily represent a physical single connection, but can be more than one connection. The Ethernet connection port 450 can be an RJ45 port, which is for example, provided in a rear side of a network node, as shown in FIG. 2E. Further, a power connection port 490 may be disposed in the rear side of the network node.

The switch unit 430 is configured to switch connections between the connectors 410*a* and 410*b*, the communication unit 460, and the RJ45 port 450 based on a control by the processor 420 or another processor located in another network node or in a remote site. The processor 420 is configured to receive, process (calculate) and transmit various data from/to other elements such as the memory 442, the storage 444, the switch unit 430, the communication unit 460 and control the elements under program codes stored in the memory 442 or the storage 444.

For example, when the RJ45 port 450 is connected to an external computer network (e.g., Ethernet network), the switch unit 430 is controlled to make a connection between the RJ45 port 450 and the communication unit 460, so that the network node 40 can communicate with the external network via the RJ45 port 450.

In a further example, as shown in FIG. 4B, where three network nodes 40_1 to 40_3 each having substantially the same configuration as the network node 40 of FIG. 4A are stacked on each other, the network node 40_3 is positioned on the bottom of the stack and connected to the wired Ethernet connection 470 (e.g., Ethernet connection plug) via the RJ45 port 450_3, the network node 40_2 is stacked on the network node 403, and the network node 40_1 is stacked on the network node 40_2. The network nodes 40_1 to 40-3 are in surface-contact with each other. Details of connections between the elements are omitted in FIG. 4B for the sake of simplicity.

This configuration allows the whole stack including the network nodes 40_1 to 40_3 to receive a wired Ethernet connection 470 through the RJ45 port 450_3, directly or indirectly.

Referring still to FIG. 4B, although all of the network nodes 401 to 403 within the stack may include an RJ45 port, it is conceivable that only one network node (e.g., 40_3) receives a wired Ethernet connection through an RJ45 port (e.g., 450_3) incorporated in that network node (e.g., 40_3) and then the Ethernet connection may be passed from node to node by the Ethernet surface connectors. For example, the Ethernet connection is received by the network node 40_3, passed to the network node 40_2 through a surface contact between the surface connectors 410*a*_3 and 410*b*_2, and then passed to the network node 40_1 through a surface contact between the surface connectors 410*a*_2 and 410*b*_1. In other words, even though only the single network node (e.g., 40_3) receives a wired Ethernet connection 470, all of the three network nodes can be connected to the network. The top two network nodes 40_1 and 40_2 will receive the connection through the Ethernet surface connectors rather than through the direct wired Ethernet connection.

To this end, in one embodiment, the switch unit 430_3 of the network node 40_3 is configured to establish a connection between the RJ45 port 450_3 and the communication unit 460_3 and a connection(s) (e.g., between the RJ45 port 450_3 and the surface connector 410*a*_3) for passing the Ethernet connection to the network node 40_2. Further, upon receiving the Ethernet connection from the network node 20_3, the switch unit 430_2 of the network node 40_2 is configured to establish a connection between the surface connector 410*b*_2 and the communication unit 460_2 and a connection(s) (e.g., between the surface connector 410*b*_2 and the surface connector 410*a*_2) for passing the Ethernet connection to the network node 40_1.

It is also conceivable that the network node to be connected to the wired Ethernet network can be any of the stacked nodes.

Although it is illustrated and described with reference to the figures that only two or three network nodes are stacked on each other, exemplary embodiments of the present disclosure are not limited thereto.

In addition, it is also conceivable that only one network node (e.g., 40_3) receives power through a power connection port (e.g., 490 of FIG. 2E) incorporated in that network node (e.g., 40_3) and then the power connection may be passed from node to node by the power surface connectors (e.g., 220*a* and 220*b* of FIGS. 2A and 2B). In other words, even though only the single network node (e.g., 40_3) receives a power connection, all of the three network nodes can be supplied with power. The top two network nodes 40_1 and 40_2 will be supplied with power through the power surface connectors.

In addition, in some embodiments with respect to FIGS. 4A and 4B, each network node includes a modified Ethernet connection port (not shown) (e.g., modified RJ45 port) in addition to the typical RJ45 port 450, 450_1, 450_2, or 450_3, or as a replacement to the typical RJ45 port.

The modified RJ45 port may have substantially the same physical shape as the typical RJ 45 port, so that it can be compatible with both of the typical RJ45 plug and a modified RJ45 plug so as to ensure a conventional connector-in-jack Ethernet connection.

Figure 5A:
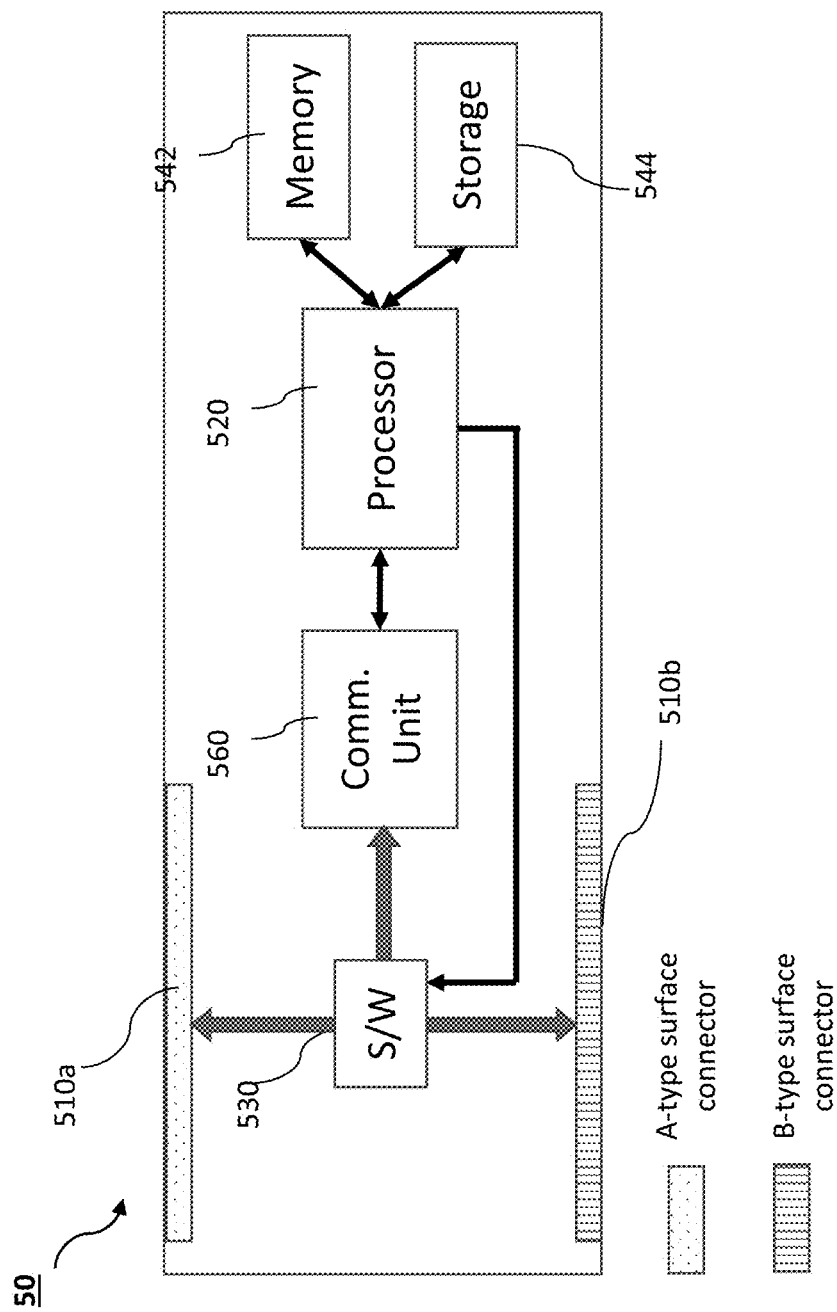
FIG. 5A depicts a block diagram of an example network node according to an exemplary embodiment of the present disclosure.

FIG. 5A depicts a block diagram of an example network node according to an exemplary embodiment of the present disclosure. FIG. 4B is a view illustrating an example configuration of stacked multiple network nodes in communication with each other according to an exemplary embodiment of the present disclosure.

Referring now to FIG. 5A, the network node 50 includes a processor 520, a memory 542, a storage 544, an A-type surface connector 510*a*, a B-type surface connector 510*b*, a communication unit 560, a switch unit (circuit) 530, and a chassis incorporating the aforementioned elements. Although it is illustrated in figures that a single line is used to show a connection between elements, the line does not necessarily represent a physical single connection, but can be more than one connection. The network node 50 has substantially the same configuration as the network node 40 except that it does not include a RJ45 port. Thus, duplicate description thereof will be omitted for the sake of simplicity.

The switch unit 530 is configured to switch connections between the connectors 510*a* and 510*b* and the communication unit 560 based on a control by the processor 520 or another processor located in anther network node or in a remote site.

Figure 5B:
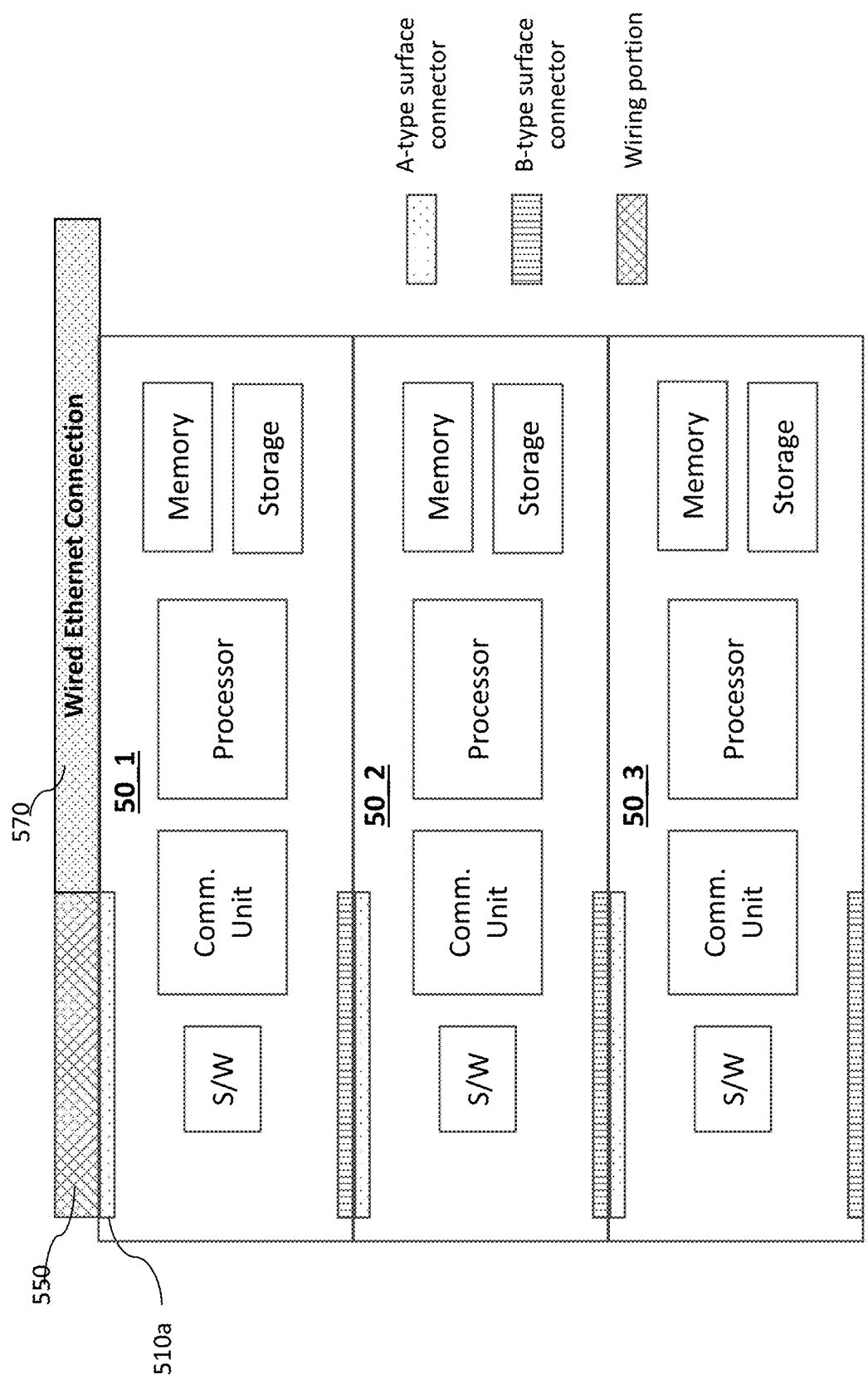
FIG. 5B is a view illustrating an example configuration of stacked multiple network nodes in communication with each other according to an exemplary embodiment of the present disclosure.

Referring further to FIG. 5B, when the multiple network nodes 50_1 to 50_3 each having substantially the same configuration as the network node 50 of FIG. 5A are stacked one on another, since each network node may not include any extra Ethernet connection port such as a typical RJ45 port, a modified RJ45 port, etc., the stack of the network nodes is connected to the wired Ethernet network by an Ethernet surface connection. In one aspect, the wired Ethernet connection 560 is made to the top network node 50_1 of the stack, as depicted in FIG. 5B. However, in another aspect, the wired Ethernet connection is made to the bottom network node 50_3 of the stack (not shown).

Referring still to FIG. 5B, a wiring portion 550 can be used for engaging the stack (e.g., the top network node 50_1) to the wired Ethernet connection 560. The wiring portion 550 includes customized (connection) wirings adapted to mate with pin arrangement of the Ethernet surface connector (e.g., 510*a* of FIG. 5B) through which the wired connection 560 is made. Since the wiring portion 550 is connected to the stack by the surface contact, it does not need to fit into a typical RJ45 port, and thus, the end surface of the wiring portion 550 facing the Ethernet surface connector may be substantially flat. In addition, the wiring portion 550 might not have a locking clip, but may have magnets disposed in such a manner that each has an opposite pole to a corresponding magnet to which it faces to contact, similar to what is described with respect to the magnet arrangement of the Ethernet surface connectors 210*a* and 210*b* of FIG. 3A.

In one aspect, the wiring portion 550 may be provided as a surface contact plug appearing on one end of a cable connected to the network. This plug type wiring portion can be connected to either the A-type surface connector 510*a* of the top network node 50_1, as depicted in FIG. 5B, or the B-type surface connector of the bottom network node 50_3.

In another aspect, the wiring portion 550 may be provided in a cap unit to cover a chassis of the top network node 50_1, or a base unit to cover a chassis of the bottom network node 50_3.

Figure 6A:
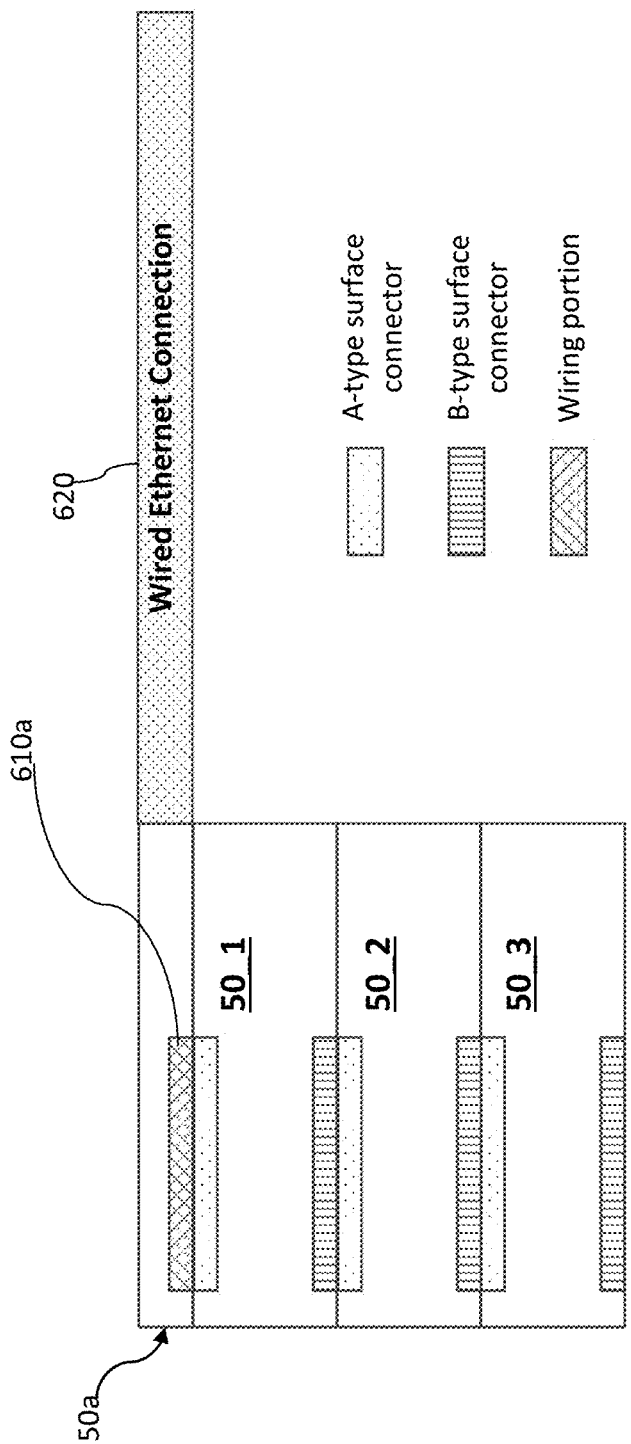
FIG. 6A is a view illustrating multiple network nodes stacked where a cap unit is used to cover a top network node according to an exemplary embodiment of the present disclosure.

FIG. 6A is a view illustrating multiple network nodes stacked where a cap unit is used to cover a top network node according to an exemplary embodiment of the present disclosure. FIG. 6B is a view illustrating multiple network nodes stacked where a base unit is used to cover a bottom network node according to an exemplary embodiment of the present disclosure.

Referring to FIG. 6A, the cap unit 50*a* is preferably sized to cover the chassis of the top network node 50_1. The cap unit 50*a* itself is connected or connectable to the network through the wired Ethernet connection 620 or any other wired or wireless connections.

Similarly, referring to FIG. 6B, the base unit 50*b* is preferably sized to cover the chassis of the bottom network node 50_3. The base unit 50*b* itself is connected or connectable to the network through the wired Ethernet connection or any other wired or wireless connections By way of examples only, the wiring portion 550 of FIG. 5B may be provided to have a B-type surface connector so as to mate with the A-type surface connector of the top network node 50_1, the wiring portion 610*a* of FIG. 6A may be provided to have a B-type surface connector so as to mate with the A-type surface connector of the top network node 50_1, and the wiring portion 610*b* of FIG. 6B may be provided to have an A-type surface connector so as to mate with the B-type surface connector of the bottom network node 50_3.

Figure 7:
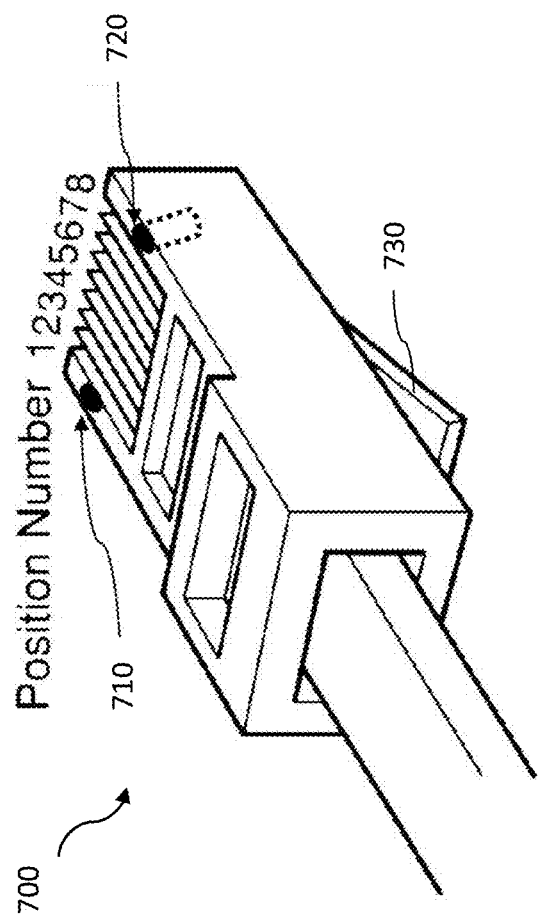
FIG. 7 is a view illustrating an example modified RJ45 plug according to an exemplary embodiment of the present disclosure.

FIG. 7 is a view illustrating an example modified RJ45 plug according to an exemplary embodiment of the present disclosure.

Referring to FIG. 7, the modified RJ45 plug 700 includes two magnets 710 and 720 disposed at opposite ends of the array of pins 740 so as to secure a proper mating when it faces the modified RJ45 port or other surface connectors whose the magnets are arranged in an opposite manner to the modified RJ45 plug 700 (e.g., N-pole magnet of the modified RJ45 plug 700 faces S-pole magnet of the modified RJ port, or vice versa). For example, each magnet 710 and 720 may be formed in a bar shape. The use of the magnets 710 and 720 allows the modified RJ45 plug 700 and the modified RJ45 port to establish an Ethernet surface connection.

In one embodiment, the stack of network nodes of FIG. 4B or FIG. 6B may be rack-mounted. In both cases, the wired Ethernet connection may easily be made to either the top or bottom chassis of the stack. For example, the rack-mount can be provided such that at least a portion of the chassis of one network node is held in contact with another so as to allow for the Ethernet surface connection.

Referring back to FIG. 7, the modified RJ45 plug 700 may optionally include a locking clip 730 so as to allow it to be connected to the typical RJ45 port, so that backwards compatibility between the typical Ethernet connection and the surface Ethernet connection is ensured.

Figure 8:
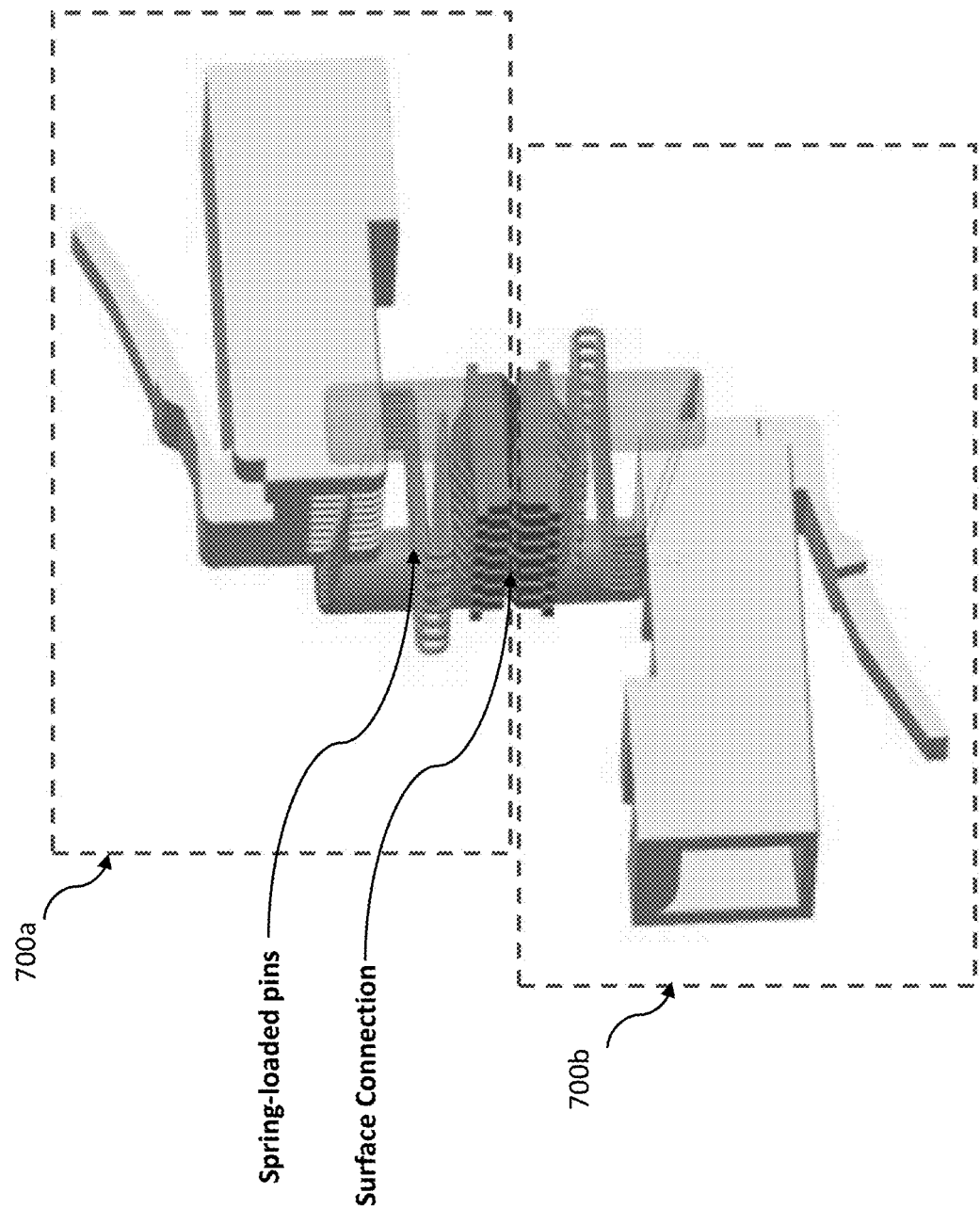
FIG. 8 is an exploded view illustrating two example modified RJ45 plugs being connected by the surface contact according to an exemplary embodiment of the present disclosure.

FIG. 8 is an exploded view illustrating two example modified RJ45 plugs 700*a* and 700*b* being connected by the surface contact according to an exemplary embodiment of the present disclosure.

Referring to FIG. 8, by virtue of each modified RJ45 plugs 700*a* and 700*b* including bar magnets (e.g., 710 and 720), the modified RJ45 plugs can serve as Ethernet surface connectors, so that when they are disposed in tandem, as shown in FIG. 8, an Ethernet connection can be made from cable to cable. The modified RJ45 plugs may be easily engaged with one another to establish the Ethernet connection.

Referring further to FIG. 8, the manner in which each pin is spring loaded is shown and the proximity of the cylindrical bar magnets is also shown in. As only the circular tops of the cylindrical bar magnets are exposed, backwards compatibility with the typical RJ45 connectors may be maintained.

Figure 9:
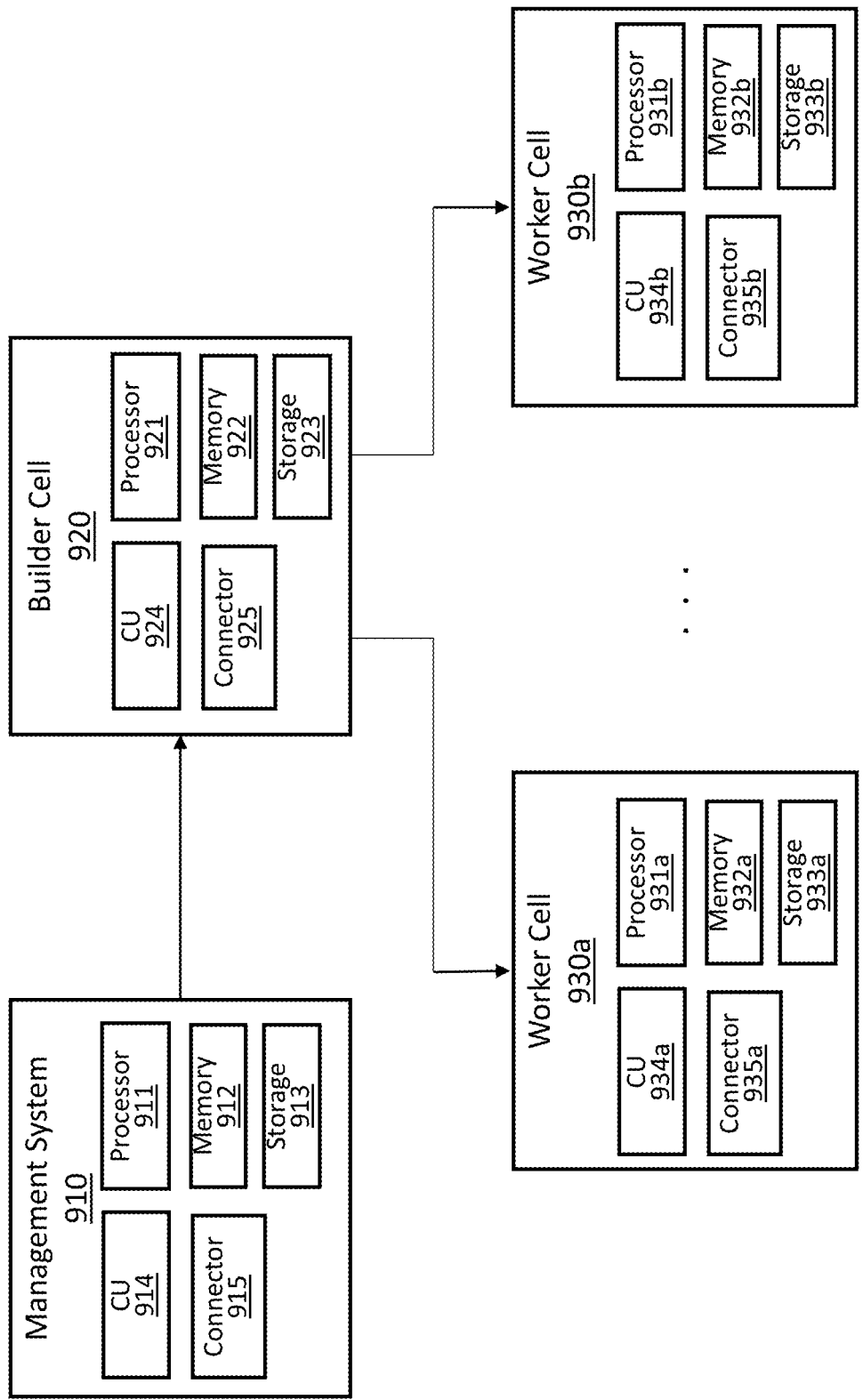
FIG. 9 depicts an example data processing system using network cells (nodes) according to an exemplary embodiment of the present disclosure.
Figure 10:
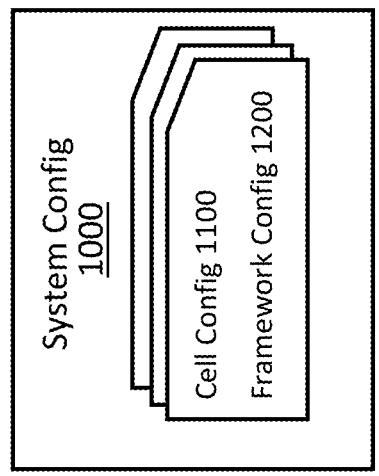
FIG. 10 is a view of an example system configuration according to an exemplary embodiment of the present disclosure.
Figure 11:
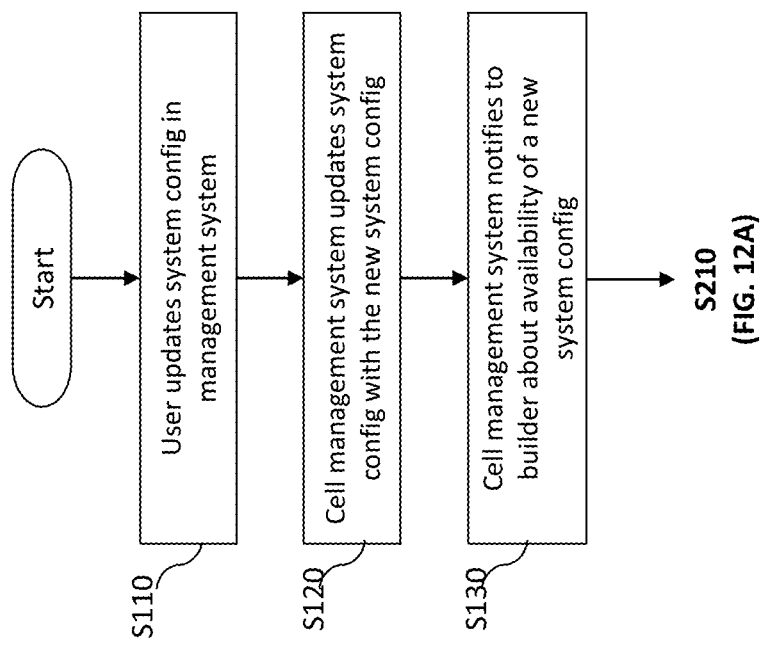

FIG. 9 depicts an example data processing system using network cells (nodes) according to an exemplary embodiment of the present disclosure. FIG. 10 is a view of an example system configuration 1000 according to an exemplary embodiment of the present disclosure. FIGS. 11, 12A-12D and 13A-13E depict flow charts of a method for updating the data processing system system with new system configuration or new cell image according to an exemplary embodiment of the present disclosure.

Referring to FIG. 9, the data processing system includes a management system (or management node) 910, a builder cell 920, and one or more worker cells 930a and 930b. The management system 910 provides a management function allows a user to set up or make changes to the configuration of cells in the data processing system. The builder cell 920 can serve as a master node that manages or control operations of the worker cells 930a and 930b. The worker cells may collaboratively work to perform the data mining, the big data analytic, or the like according to the control by the builder cell 920. Although only two worker cells are illustrated in FIG. 9, exemplary embodiments of the present disclosure are not limited thereto.

The builder cell 920 and/or the worker cells 930a and 930b each may correspond to one of the network nodes 20, 20', 40, 40_1 to 40_3, 50, 50_1 to 50_3 of FIGS. 2A-2E, 3A-3B, 4A-4B, 5A-5B and 6A-6B or have substantially the same configuration as one of those network nodes of FIGS. 2A-2E, 3A-3B, 4A-4B, 5A-5B and 6A-6B. Further, it is conceived that at least two or more of the builder cell 920 and/or the worker cells 930a and 930b are stacked one on another, while being in communication one with another through surface-contacts as described with reference to FIGS. 2A-2E, 3A-3B, 4A-4B, 5A-5B and 6A-6B. In a more particular example, the builder cell (e.g., 920) can be considered as a network node (e.g., 40_1 of FIG. 4B) which receives a wired Ethernet connection and passes the Ethernet connection to other work cells (e.g., 930a and 930b) which can be considered as network nodes (e.g., 40_2 and 40_3 of FIG. 4B) stacked on the network node (e.g., 40_1).

The management system 910 includes one or more processors 911, memory 912 coupled to the processors, a storage 913, a communication unit 914, a communication connector 915, etc.

The builder cell 920 includes one or more processors 921, memory 922 coupled to the processors, a storage 923, a communication unit 924, a communication connector 925, etc.

Each worker cell 930a (or 930b) includes one or more processors 931a (or 931b), memory 932a (or 932b) coupled to the processors, a storage 933a (or 933b), a communication unit 934a (or 934b), a communication connector 935a (or 935b), etc.

The management system 910 may further include a user interface (not shown) for receiving an input from a user with respect to the update of the system configuration or a new cell image.

Referring to FIG. 10, the system configuration 1000 includes one or more cell configurations 1100 and one or more framework configurations 1200.

The cell configuration 1100 is in association with each physical stack consisting of physically connected network cells, so the cell configuration 1100 may define physical interfaces and interactions among the cells in each stack and/or among stacks, which allows the stack(s) communicate, report and detect various hardware, irrespective of applications running on any individual cell(s).

Further, the framework configuration 1200 is in association with each logical cluster for a specific workload application framework associated with individual cells, so the framework configuration 1200 may define frameworks with which individual cells are associated. Each stack may contain a homogeneous framework or heterogeneous frameworks. By way of example only, if there are a physical stack of 8 cells that are all running a Spark cluster architecture for data processing and another physical stack of 8 units that are running Hadoop cluster, a user decides to create a logical cluster, for example, Kubernetes cluster, by using two cells from the Spark stack and two cells from the Hadoop stack. Here, the logical cluster is distinguished from a physical stack since the 4 cells of the logical cluster are based on cells from two separate physical stacks. This may leave one stack to have 6 cells running Spark and 2 cells running Kubernetes and another stack to have 6 cells running Hadoop and 2 cells running Kubernetes.

Referring to FIGS. 11 and 12A-12D, the method for updating the system configuration or the new cell image starts with step S110 where a user updates the system configuration (e.g., 1000) through the management system (e.g., 910). The user may communicate through a wired or wireless connection with the management system.

Next, the management system stores the system configuration into a storage (e.g., 913) (S120).

In step S130, the management system notifies to the builder cell (e.g., 920) through a communication unit (e.g., 914) that the new system configuration is available. If the management system is locally connected to the builder cell, the above notification can be made via a local connection.

Figure 12A:
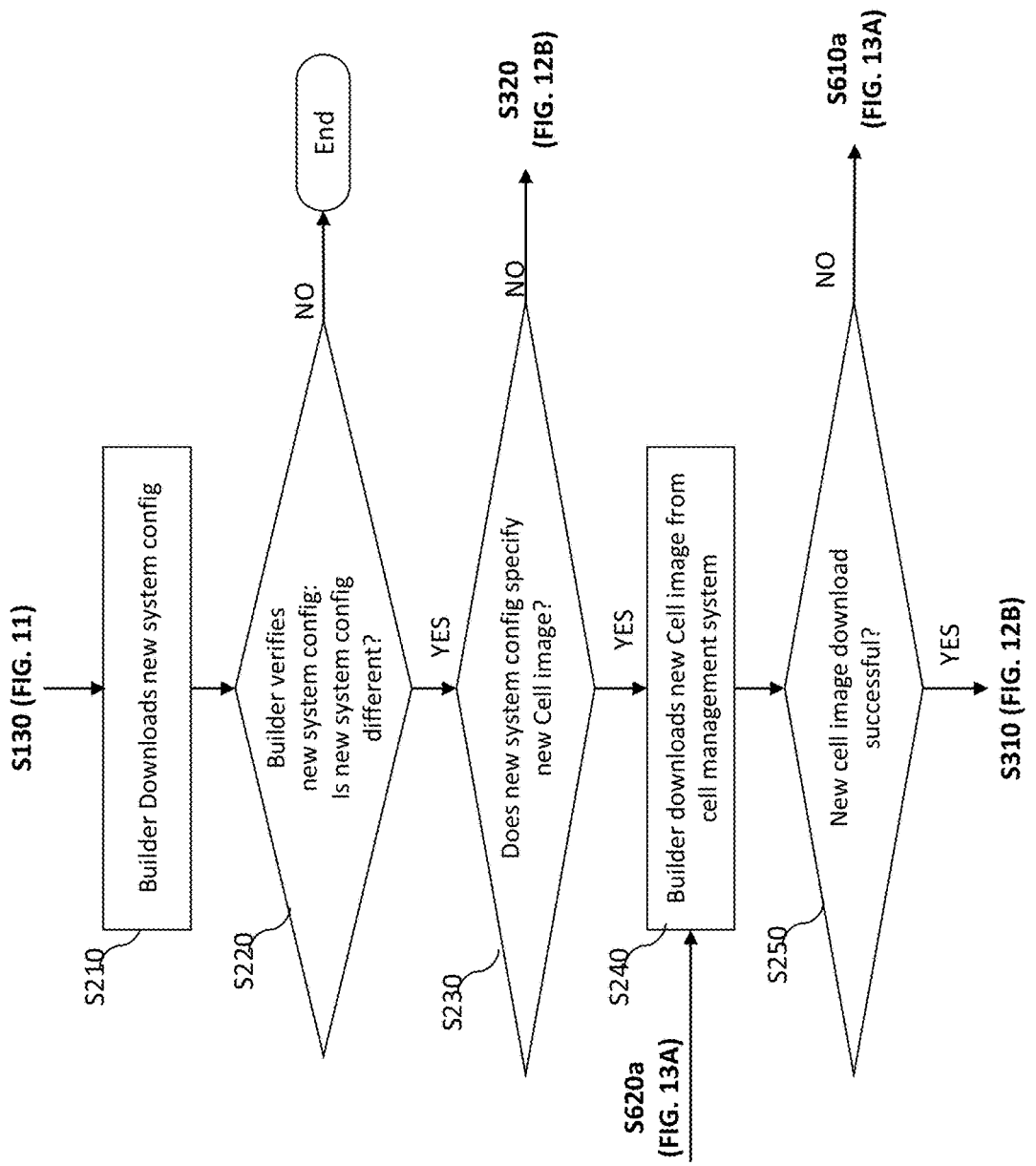
Figure 12B:
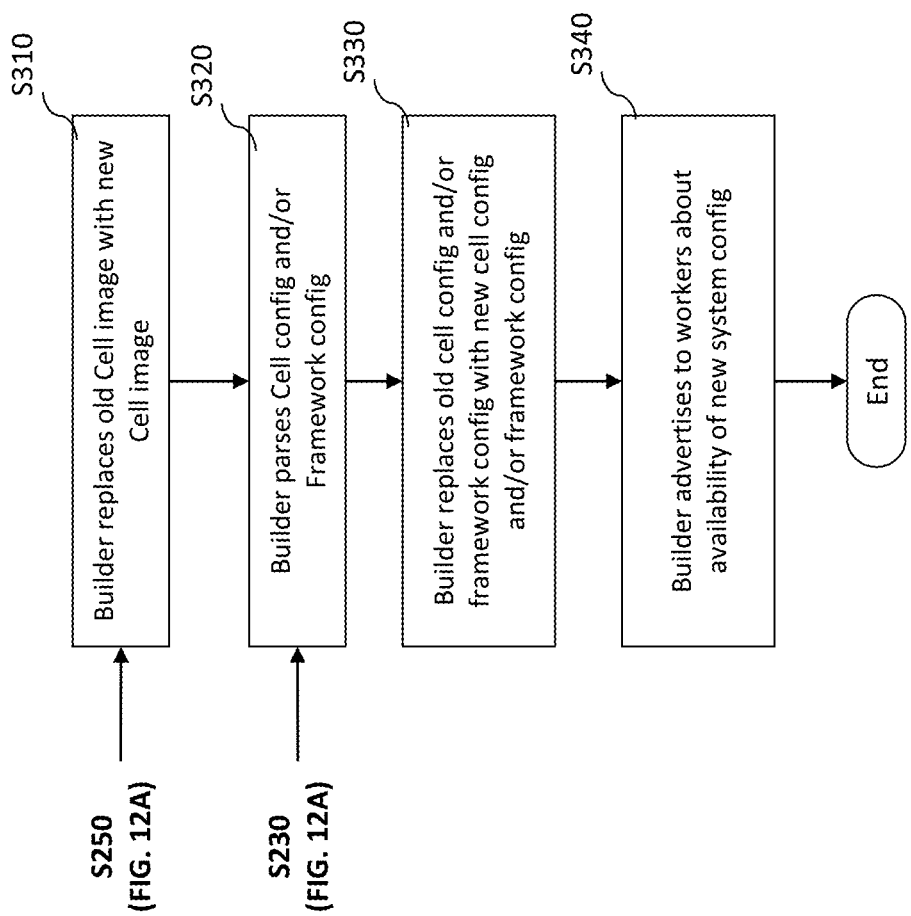

Referring further to FIG. 12A, the builder cell connects to the management system, downloads the new system configuration therefrom, and stores the same into a storage (e.g., 923) (S210), and parses and verifies the new system configuration (S220). For example, the verifying of the new system configuration in S220 may include determine whether the new system configuration is different from a previous system configuration. If it is determined that the new system configuration is different from the previous one (YES), the method goes to step S230 where the builder cell determines whether the new system configuration specifies a new cell image; otherwise (NO), the method ends.

The new cell image may include information in regard to the configuration of the physical connection (e.g., cell configuration 1100) of a stack which the builder cell and the worker cell(s) constitute and the configuration of the desired framework (e.g., framework configuration 1200). By way of example only, if there was given a stack of 8 cells all running Spark previously and the new cell image indicates that two of the cells have been reallocated to run Hadoop, the new framework configuration 1200 to the two cells reallocated to run Hadoop would be generated and provided as part of the new cell image If it is determined that the new system configuration specifies a new cell image (YES), the builder cell connects to the management system, downloads the new cell image therefrom, and stores the same into the storage (e.g., 923) (S240); otherwise (NO), the method goes to step S320 of FIG. 12B.

Figures 13A, 13B, 13C:
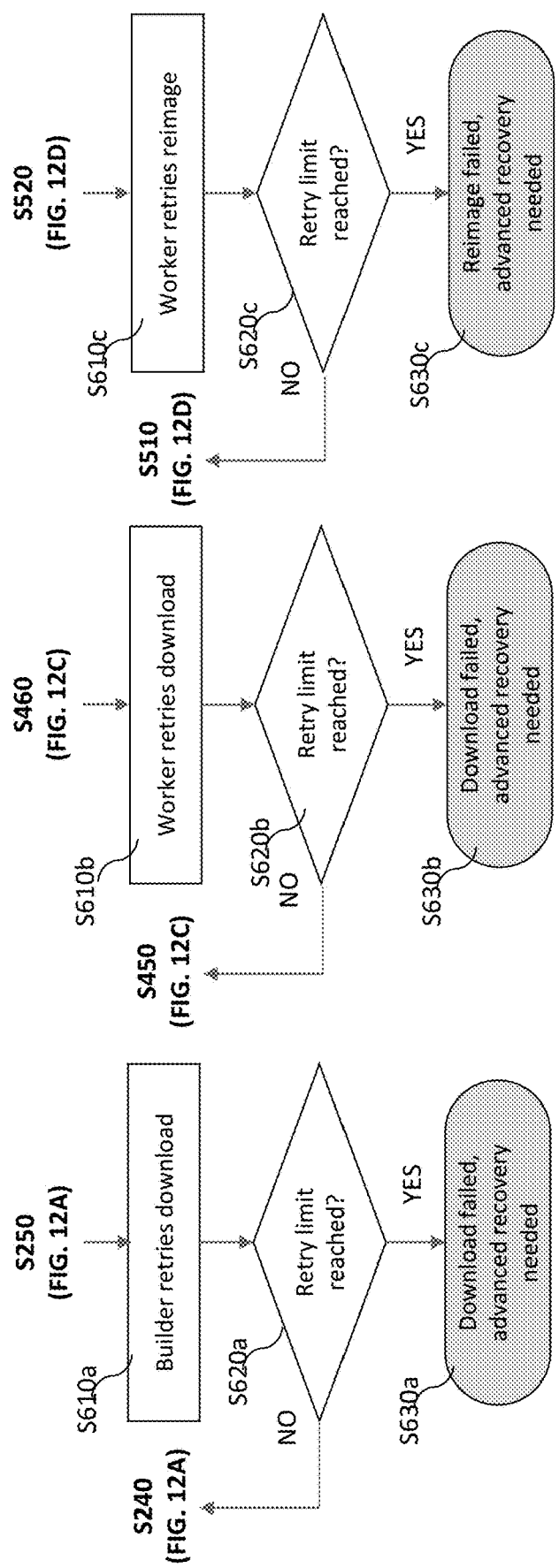

Next to the step S240, it is determined whether the new cell image is downloaded successfully in S250. If the new cell image is downloaded successfully (YES), the method goes to the step S310 of FIG. 12B where the builder cell 920 replaces an old cell image with the new cell image; otherwise (NO), the method goes to S610*a* of FIG. 13A where the builder cell retries the downloading of the new cell image. Referring further to FIG. 13A, if a retry limit is not reached in step S620*a* (NO), the method goes to S240 of FIG. 12A; otherwise (YES), the builder cell determines that the download fails and optionally performs an advanced recovery action (S630*a*).

In one embodiment, in the advanced recovery action S630*a*, the method may return to a "Known good state" if the last state of the stack is still functioning properly and it leaves it as is. However, if the system is in an unknown or indeterminate state, the recovery will be to reboot to a built in "factory reset" state and attempt to redownload the cell configuration. This accounts for systems that are behind a firewall and not allowed access to the network or systems that have had a malfunction and cannot recover therefrom.

Next to the step S310, the builder cell parses a new cell configuration and/or a new framework configuration from the system configuration (S320) and replaces an old cell configuration and/or a framework configuration with the new cell configuration and/or the new framework configuration (S330).

Next, in step S340, the builder cell advertises to the worker cells (e.g., 930*a* or 930*b*) that the new system configuration is available and ends provisioning process of the builder cell.

Figure 12D:
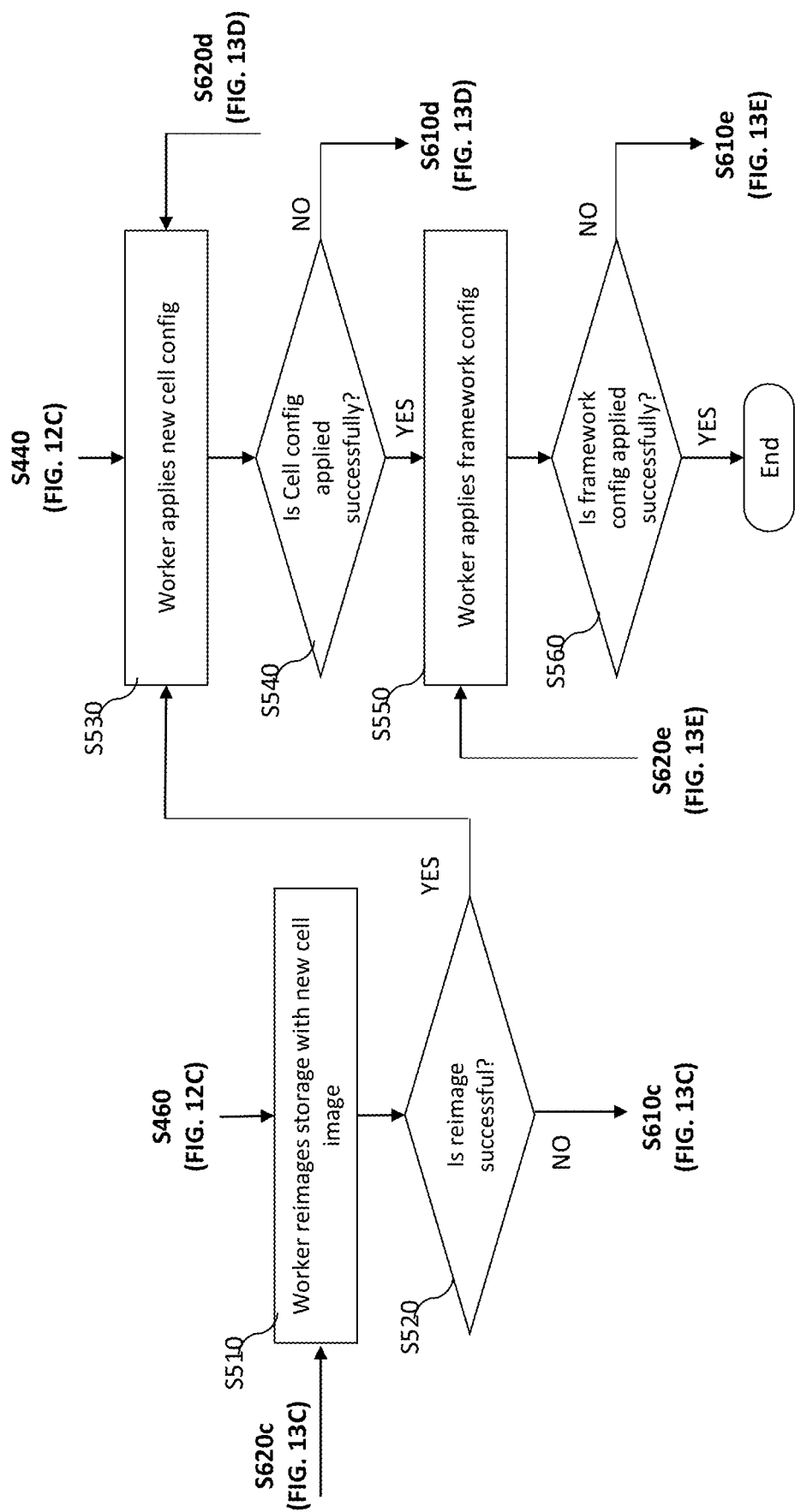

Referring further to FIGS. 12C and 12D illustrating local provisioning of each worker cell, the method starts with each worker cell receives a notice from the builder cell 920 that the new system configuration is available (S410). The worker cell connects to the builder cell, downloads the new system configuration therefrom, and store the same into a storage (e.g., 933*a* or 933*b*) (S420).

Next, in step S430, the worker cell parses and verifies the new system configuration. For example, the verifying of the new system configuration in S430 may include determine whether the new system configuration is different from a previous system configuration. If it is determined that the new system configuration is different from the previous one (YES), the method goes to step S440 where the worker cell determines whether the new system configuration specifies a new cell image; otherwise (NO), the method ends.

In addition, if it is determined that the new system configuration specifies a new cell image (YES), each worker cell connects to the builder cell, downloads the new cell image therefrom, and stores the same into the storage (e.g., 933*a* or 933*b*) (S450); otherwise (NO), the method goes to step S530 of FIG. 12D.

Next to the step S450, it is determined whether the new cell image is downloaded successfully in S460. If the new cell image is downloaded successfully (YES), the method goes to the step S510 of FIG. 12D where the worker cell reimages a storage (e.g., 933*a* or 933*b* of FIG. 9) with the new cell image; otherwise (NO), the method goes to S610*b* of FIG. 13B where the worker cell retries downloading the new cell image. Referring further to FIG. 13B, if a retry limit is not reached in step S620*b* (NO), the method goes to S450 of FIG. 12C; otherwise (YES), the worker cell determines that the download fails and optionally performs an advanced recovery action (S630*b*).

In one embodiment, in the advanced recovery action S630*b*, the method may return to a "Known good state" if the last state of the stack is still functioning properly and it leaves it as is. However, if the system is in an unknown or indeterminate state, the recovery will be to reboot to a built in "factory reset" state and attempt to redownload the cell configuration. This accounts for systems that are behind a firewall and not allowed access to the network or systems that have had a malfunction and cannot recover therefrom.

Referring now to FIG. 12D, next to the step S510, it is determined that the reimage using the new cell image is successfully applied to the storage (e.g., 933*a* or 933*b*) (S520). If the reimage is successfully applied (YES), the method goes to step S530 where the worker cell applies the new cell configuration; otherwise, the method goes to S610*c* of FIG. 13C where the worker cell retries the reimaging. Referring further to FIG. 13C, if a retry limit is not reached in step S620*c* (NO), the method goes to S510 of FIG. 12D; otherwise (YES), the worker cell determines that the reimage fails and optionally performs an advanced recovery action (S630*c*).

In one embodiment, in the advanced recovery action S630*c*, the method may return to a "Known good state" if the last state of the stack is still functioning properly and it leaves it as is. However, if the system is in an unknown or indeterminate state, the recovery will be to reboot to a built in "factory reset" state and attempt to redownload the cell configuration. This accounts for systems that are behind a firewall and not allowed access to the network or systems that have had a malfunction and cannot recover therefrom.

Figures 13D, 13E:
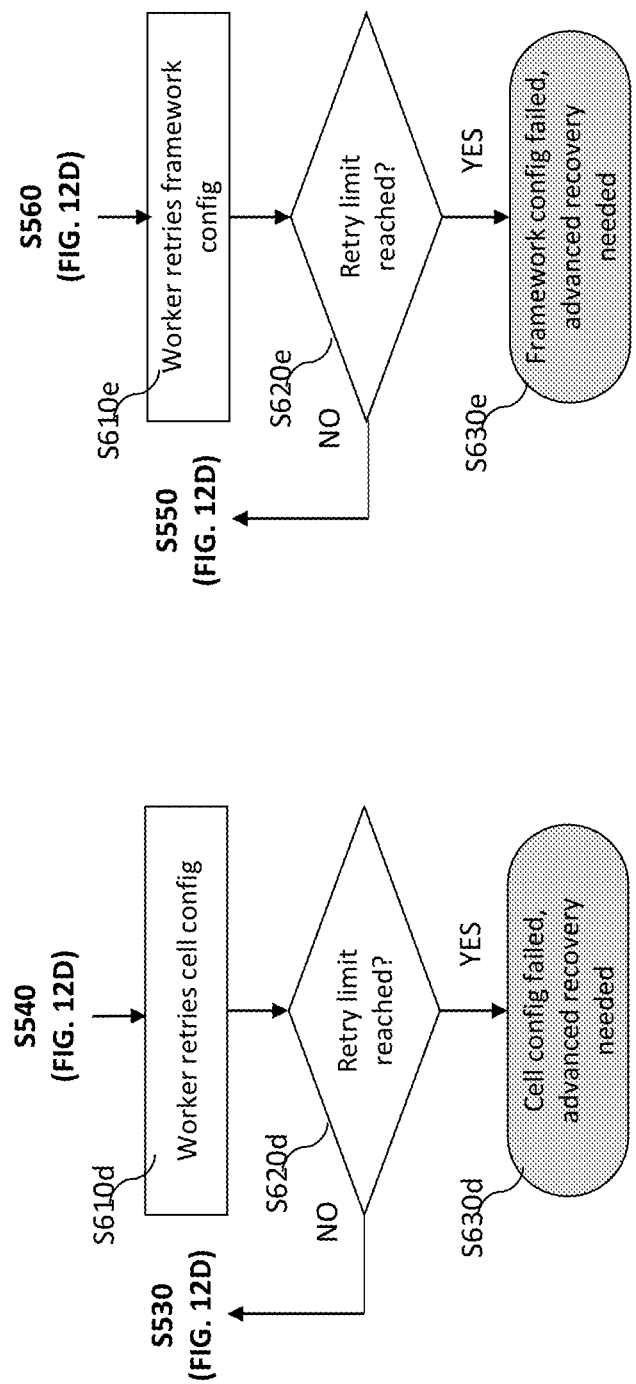

In addition, in step S540, it is determined that the cell configuration is successfully applied. If the cell configuration is successfully applied (YES), the method goes to step S550 where the worker cell applies the framework configuration; otherwise, the method goes to S610*d* of FIG. 13D where the worker cell retries applying the cell configuration. Referring further to FIG. 13D, if a retry limit is not reached in step S620*d* (NO), the method goes to S530 of FIG. 12D; otherwise (YES), the worker cell determines that the applying of the new cell configuration fails and optionally performs an advanced recovery action (S630*d*).

In one embodiment, in the advanced recovery action S630*d*, the method may return to a "Known good state" if the last state of the stack is still functioning properly and it leaves it as is. However, if the system is in an unknown or indeterminate state, the recovery will be to reboot to a built in "factory reset" state and attempt to redownload the cell configuration. This accounts for systems that are behind a firewall and not allowed access to the network or systems that have had a malfunction and cannot recover therefrom.

In addition, in step S560, it is determined that the framework configuration is successfully applied. If the framework configuration is successfully applied (YES), the method successfully ends; otherwise, the method goes to S610*e* of FIG. 13E where the worker cell retries applying the framework configuration. Referring further to FIG. 13E, if a retry limit is not reached in step S620*e* (NO), the method goes to S550 of FIG. 12D; otherwise (YES), the worker cell determines that the download fails and optionally performs an advanced recovery action (S630*e*).

In one embodiment, in the advanced recovery action S630*e*, the method may return to a "Known good state" if the last state of the stack is still functioning properly and it leaves it as is. However, if the system is in an unknown or indeterminate state, the recovery will be to reboot to a built in "factory reset" state and attempt to redownload the cell configuration. This accounts for systems that are behind a firewall and not allowed access to the network or systems that have had a malfunction and cannot recover therefrom.

Figure 14A:
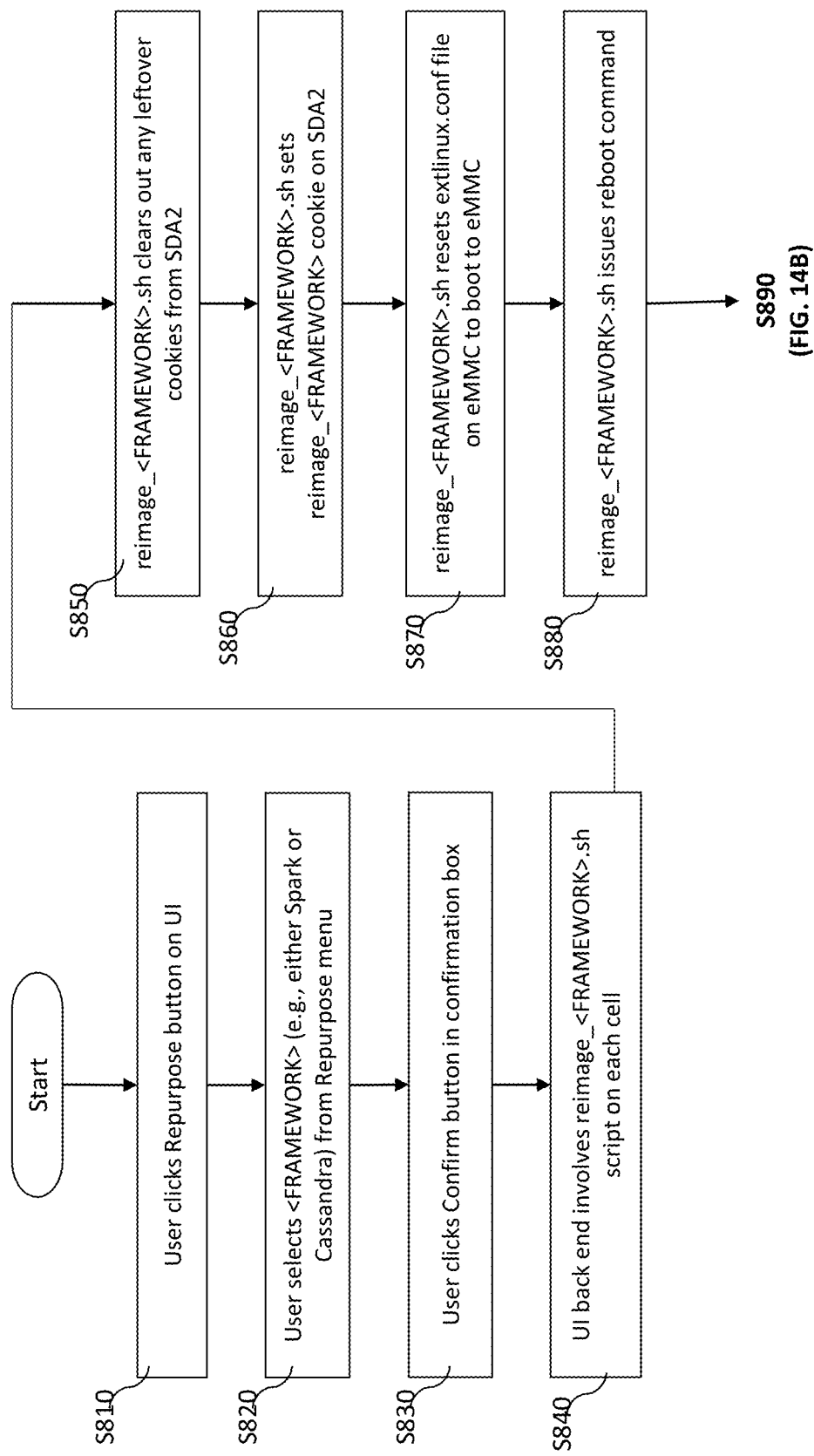
FIGS. 14A and 14B depict flow charts of a method for reimaging a local cell according to an exemplary embodiment of the present disclosure.
Figure 14B:
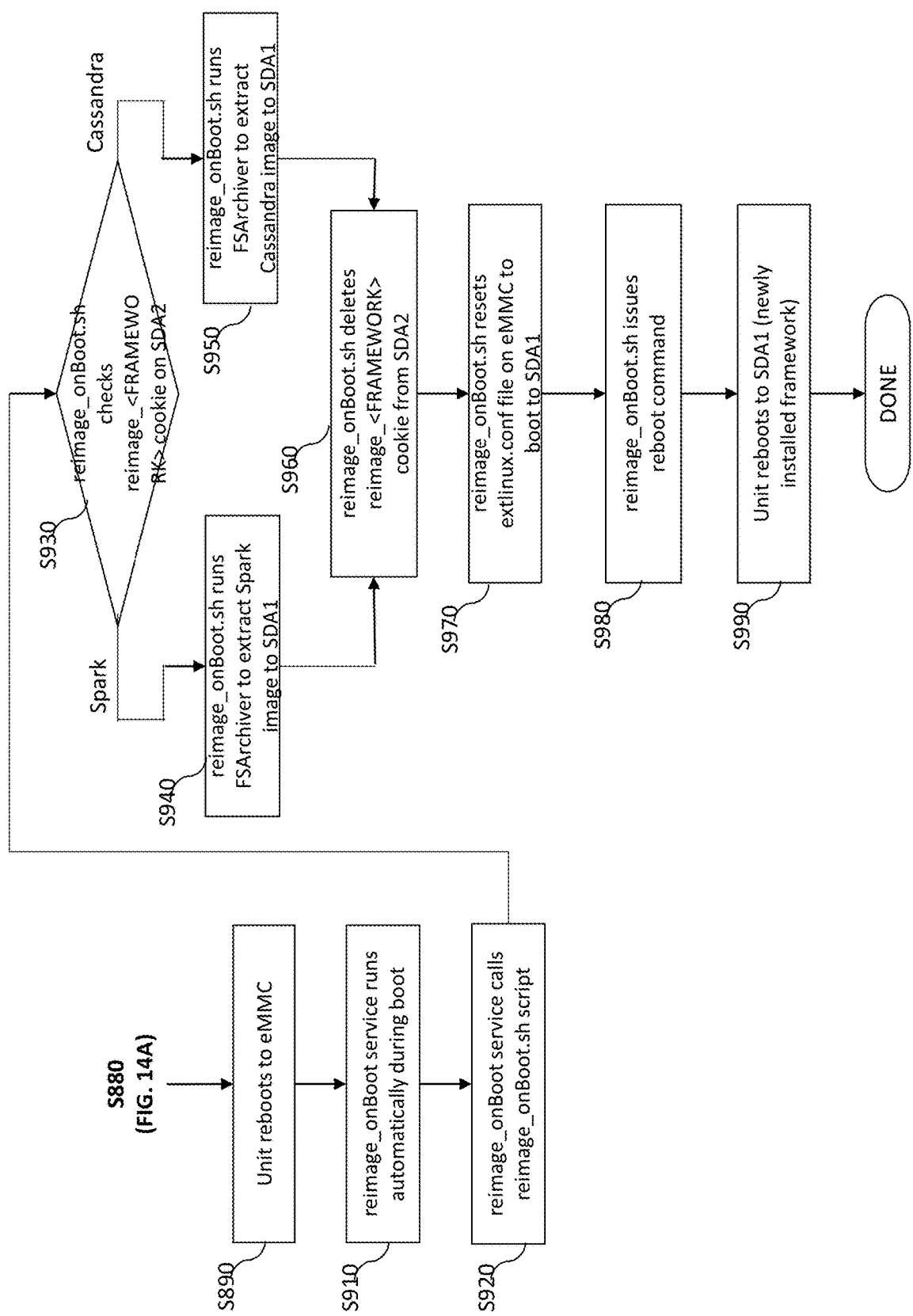

FIGS. 14A and 14B depict flow charts of a method for reimaging (or repurpose) a local cell worker cell according to an exemplary embodiment of the present disclosure.

The flow charts shown in FIGS. 14A and 14B and related descriptions below can be considered as an example embodiment to perform the step S510 of FIG. 12D.

Referring to FIG. 14A, the method for reimaging each local cell can mainly be into three key sections with respect to user/user interface (UI) actions, local cell (e.g., a worker cell)'s automated actions to be booted to SDA1 (e.g., the first partition of the first hard disk drive), and the local cell's automated actions to be booted to eMMC (Embedded MultiMedia Card). For example, the local cell can be a worker cell (e.g., 930a or 930b of FIG. 9) or a builder cell (e.g., 920 of FIG. 9).

Regarding the user/UI actions, referring to FIG. 14A, a user clicks a repurpose button on user interface (UI) (S810) and selects a FRAMEWORK from the repurpose menu (S820). For example, the UI can be implemented in the management system (e.g., 910 of FIG. 9) or implemented directly in each local cell, and the framework can be either 'Spark' or 'Cassandra'. Next, the user clicks a confirmation button in a confirmation box of the UI (S830). In step S840, the UI back-end involves a reimage script (e.g., reimage_<FRAMEWORK>.sh) on each local cell.

In addition, regarding the local cell's automated actions to be booted to SDA1, referring further to FIG. 14A, the reimage script clears out any leftover cookies from SDA2 (e.g., the second partition of the first hard disk drive) (S850) and sets a reimage cookie (e.g., reimage_<FRAMEWORK>) on SDA2 (S860). Next, the reimage script resets a configuration file (e.g., extlinux.conf) on eMMC to boot to eMMC (S870) and issues a reboot command (S880).

In addition, regarding the local cell's automated actions to be booted to eMMC, referring now to FIG. 14B, the local cell reboots to eMMC (S890) and a service (e.g., reimage_onBoot) runs automatically during boot (S910). Further, the service (e.g., reimage_onBoot.sh) calls a reimage boot script (e.g., reimage_onBoot.sh) (S920). Next, the reimage boot script checks a reimage cookie (e.g., reimage_<FRAMEWORK> on SDA2 (S930). If the reimage cookie indicates 'Spark', the reimage boot script (e.g., reimage_onBoot.sh) runs an FSArchiver to extract Spark image to SDA1 (S940). If the reimage cookie indicates 'Cassandra', the reimage boot script (e.g., reimage_onBoot.sh) runs an FSArchiver to extract Cassandra image to SDA1 (S950). Next, the reimage boot script (e.g., reimage_onBoot.sh) deletes the reimage cookie (e.g., reimage_<FRAMEWORK>) from SDA2 (S960), resets a configuration file (e.g., extlinux.conf) on eMMC to boot to SDA1 (S970), and issues a reboot command (S980).

In addition, as part of the local cell's automated actions to be booted to SDA1, the local cell reboots to SDA1 with newly installed framework (S990).

By way of example only, the data processing system of FIG. 9 can be a stand-alone server cluster including one or more cells (e.g., 920, 930a and 930b). The system has an initial state in which it boots up. Preloaded cells will go through the initial bootup sequence to determine if a user-defined configuration is loaded and then choose that as their startup path. As the cells are stacked, they have a protocol that allows them to identify, validate and configure based on a user managed configuration. The ability to reconfigure the cells is managed through an interface (e.g., user interface) that allows the user to select pre-packaged frameworks or use their own created frameworks. This is different than standard plug and play peripheral devices in that the peripheral device is not a stand-alone device. The plug and play peripheral devices have standard drivers downloaded and installed from a main computer to which they are coupled. The main computer may have the required drivers for each peripheral device or control all mechanisms to have the corresponding drivers automatically retrieved and downloaded to the peripheral devices, so that the user does not have to manually install them in order to use the peripheral devices.

Figure 15:
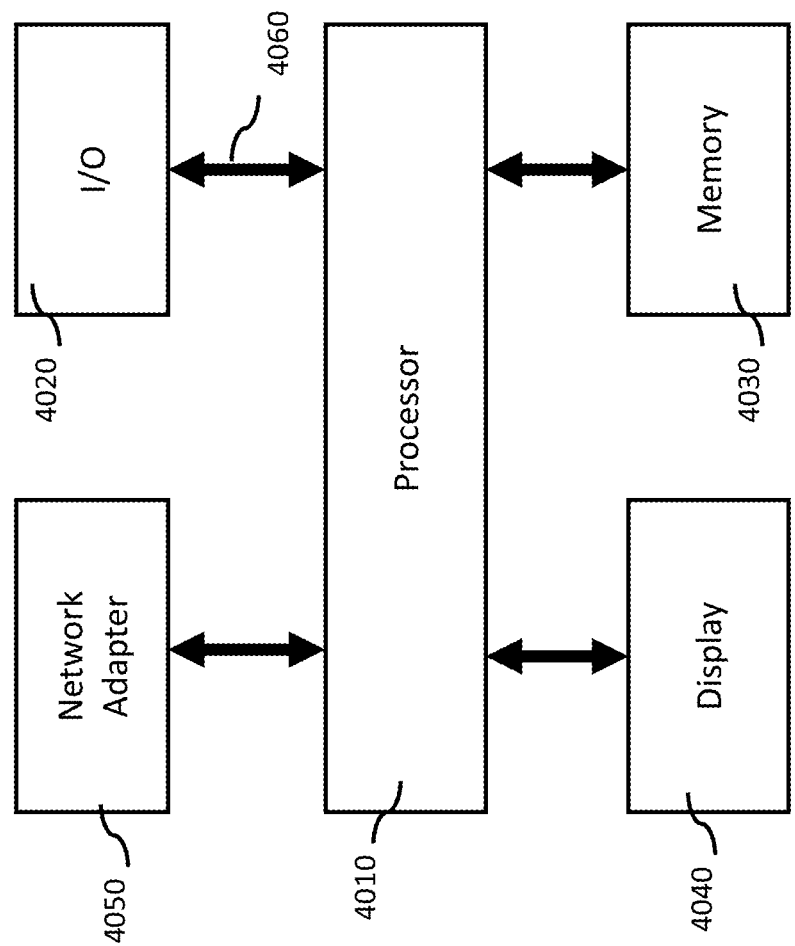
FIG. 15 is a block diagram of a computing system according to an exemplary embodiment of the present disclosure.

FIG. 15 is a block diagram of a computing system 4000 according to an exemplary embodiment of the present disclosure.

Referring to FIG. 15, the computing system 4000 may be used as a platform for performing: the functions or operations described hereinabove with respect to at least one of the network node (or cells) 20, 20', 40, 40_1 to 40_3, 50, 50_1 to 503, 910, 920, 930a and 930b of FIGS. 2A-2E, 3A-3B, 4A-4B, 5A-5B, 6A-6B and 9; and the methods described with reference to FIGS. 11, 12A-12D, 13A-13E and 14A-14B.

Referring to FIG. 15, the computing system 4000 may include a processor 4010, I/O devices 4020, a memory system 4030, a display device 4040, and/or a network adaptor 4050.

The processor 4010 may drive the I/O devices 4020, the memory system 4030, the display device 4040, and/or the network adaptor 4050 through a bus 4060.

The computing system 4000 may include a program module for performing: the functions or operations described hereinabove with respect to at least one of the network node (or cells) 20, 20', 40, 40_1 to 40_3, 50, 50_1 to 50_3, 910, 920, 930a and 930b of FIGS. 2A-2E, 3A-3B, 4A-4B, 5A-5B, 6A-6B and 9; and the methods described with reference to FIGS. 11, 12A-12D, 13A-13E and 14A-14B. For example, the program module may include routines, programs, objects, components, logic, data structures, or the like, for performing particular tasks or implement particular abstract data types. The processor (e.g., 4010) of the computing system 4000 may execute instructions written in the program module to perform: the functions or operations described hereinabove with respect to at least one of the network node (or cells) 20, 20', 40, 40_1 to 40_3, 50, 50_1 to 50_3, 910, 920, 930a and 930b of FIGS. 2A-2E, 3A-3B, 4A-4B, 5A-5B, 6A-6B and 9; and the methods described with reference to FIGS. 11, 12A-12D, 13A-13E and 14A-14B. The program module may be programmed into the integrated circuits of the processor (e.g., 4010). In an exemplary embodiment, the program module may be stored in the memory system (e.g., 4030) or in a remote computer system storage media.

The computing system 4000 may include a variety of computing system readable media. Such media may be any available media that is accessible by the computer system (e.g., 4000), and it may include both volatile and non-volatile media, removable and non-removable media.

The memory system (e.g., 4030) can include computer system readable media in the form of volatile memory, such as RAM and/or cache memory or others. The computer system (e.g., 4000) may further include other removable/non-removable, volatile/non-volatile computer system storage media.

The computer system (e.g., 4000) may communicate with one or more devices using the network adapter (e.g., 4050). The network adapter may support wired communications based on Internet, local area network (LAN), wide area network (WAN), or the like, or wireless communications based on code division multiple access (CDMA), global system for mobile communication (GSM), wideband CDMA, CDMA-2000, time division multiple access (TDMA), long term evolution (LTE), wireless LAN, Bluetooth, Zig Bee, or the like.

Exemplary embodiments of the present disclosure may include a system, a method, and/or a non-transitory computer readable storage medium. The non-transitory computer readable storage medium (e.g., the memory system 4030) has computer readable program instructions thereon for causing a processor to carry out aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EEPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to the computing system 4000 from the computer readable storage medium or to an external computer or external storage device via a network (e.g., computer network). The network may include copper transmission cables, optical transmission fibers, wireless transmission, routers, firewalls, switches, gateway computers and/or edge servers. A network adapter card (e.g., 4050) or network interface in each computing/processing device receives computer readable program instructions from the network and forwards the computer readable program instructions for storage in a computer readable storage medium within the computing system.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computing system (e.g., 4000) through any type of network, including a LAN or a WAN, or the connection may be made to an external computer (for example, through the Internet using an Internet Service Provider). In an exemplary embodiment, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, system (or device), and computer program products (or computer readable medium). It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present invention has been particularly shown and described with respect to preferred embodiments thereof; it will be understood by those skilled in the art that the foregoing and other changes in forms and details may be made without departing from the spirit and scope of the present invention. It is therefore intended that the present invention not be limited to the exact forms and details described and illustrated but fall within the scope of the appended claims.

What is claimed is:

1. A first network node, comprising:
   a chassis having a first surface and a second surface;
   a computing device positioned in the chassis;
   a first surface connector configured to provide a first electrical connection for at least one of data or power, the first surface connector positioned on the first surface of the chassis and including a first set of pins and a first groove or protrusion formed on the first surface of the chassis and positioned peripherally about the first set of pins; and
   a second surface connector configured to provide a second electrical connection for at least one of data or power, the second surface connector positioned on the second surface of the chassis and including a second set of pins and a second groove or protrusion formed on the second surface of the chassis and positioned peripherally about the second set of pins,
   wherein the first network node is in electrical communication with a second network node stacked vertically above or vertically below and in contact with the first network node via the first surface connector or the second surface connector of the first network node and a corresponding surface connector positioned on the second network node.

2. The network node of claim 1, wherein the first network node is a computer server.

3. The network node of claim 1,
   wherein the second surface is on a side of the chassis opposite the first surface.

4. The network node of claim 1, wherein the first surface connector comprises:
   one or more first magnetic elements having opposite poles to each other, disposed adjacent to opposite ends of the first set of pins,
   wherein the second surface connector comprises:
   one or more second magnetic elements having opposite poles to each other, disposed adjacent to opposite ends of the second set of pins, and
   wherein the poles of the second magnetic elements are opposite to a corresponding one of the first magnetic elements.

5. The system of claim 1, wherein when the first network node is directly connected to a computer network, and the second network node is in electrical communication with the computer network through the first surface connector or the second surface connector.

6. The system of claim 1, wherein the first set of pins of the first surface connector are disposed in one manner of being elevated from the first surface and being indented toward the first surface, and the second set of pins of the second surface connector are disposed in another manner of being indented toward the second surface and being elevated from the second surface.

7. The system of claim 6, wherein at least one of the first set of pins and the second set of pins is formed in a spring-loaded manner.

8. The system of claim 1, wherein when the first network node is connected to a power source, the second network node is supplied with power through the first or second surface connectors.

9. A data processing system for controlling the system of claim 1, comprising:
   a management system configured to:
      receive an update request for a new configuration of the data processing system; and
      notify the first network node that the new configuration of the data processing network system is available; and
   the first network node configured to:
      receive the new configuration from the management system upon receipt of the notification;
      acquire a new cell configuration and a new framework configuration from the new configuration; and
      update a cell configuration and a framework configuration with the new cell configuration and the new framework configuration.

10. The data processing system of claim 9, wherein the first network node is further configured to:
    notify the second network node that the new configuration is available,
    wherein the second network node is configured to:
       receive the new configuration from the first network node upon receipt of the notification;
       acquire a new cell configuration and a new framework configuration from the new configuration; and
       apply the new cell configuration and the new framework configuration.

11. The system of claim 10, wherein the first network node is further configured to:
    receive a new cell image upon determining that the new configuration specifies the new cell image; and
    update a cell image with the new cell image after verifying the new cell image.

12. The system of claim 11, wherein the second network node is further configured to:
    receive the new cell image upon determining that the new configuration specifies the new cell image; and
    reimage a storage device with the new cell image after verifying the new cell image.

13. A method for operating the system of claim 1, comprising:

receiving, by a management system, an update request for a new configuration of the data processing system;

notifying, by the management system, the first network node that the new configuration of the data processing network system is available;

receiving, by the first network node, the new configuration from the management system upon receipt of the notification;

acquiring, by the first network node, a new cell configuration and a new framework configuration from the new configuration; and updating, by the first network node, a cell configuration and a framework configuration with the new cell configuration and the new framework configuration.

14. The method of claim 13, further comprising:

notifying, by the first network node, the second network node that the new configuration is available;

receiving, by the second network node, the new configuration from the first network node upon receipt of the notification;

acquiring, by the second network node, a new cell configuration and a new framework configuration from the new configuration; and applying, by the second network node, the new cell configuration and the new framework configuration.

* * * * *